(12) United States Patent
Chung et al.

(10) Patent No.: US 7,557,050 B2
(45) Date of Patent: Jul. 7, 2009

(54) METHOD OF MANUFACTURING POLYSILICON THIN FILM AND METHOD OF MANUFACTURING THIN FILM TRANSISTOR HAVING THE SAME

(75) Inventors: Se-Jin Chung, Yongin-si (KR);
Chi-Woo Kim, Seoul (KR); Ui-Jin Chung, Suwon-si (KR); Dong-Byum Kim, Seoul (KR)

(73) Assignee: Samsung Electroncis Co., Ltd., Gyeonggi-do (KR)

( * ) Notice: Subject to any disclaimer, the term of this patent is extended or adjusted under 35 U.S.C. 154(b) by 397 days.

(21) Appl. No.: 11/234,609

(22) Filed: Sep. 23, 2005

(65) Prior Publication Data
US 2006/0228908 A1     Oct. 12, 2006

(30) Foreign Application Priority Data

Apr. 6, 2005   (KR) .................. 10-2005-0028628
Apr. 6, 2005   (KR) .................. 10-2005-0028629
Apr. 6, 2005   (KR) .................. 10-2005-0028632

(51) Int. Cl.
*H01L 21/00*   (2006.01)
(52) U.S. Cl. .............. 438/798; 438/488; 438/799; 257/E21.482; 257/E21.475

(58) Field of Classification Search .......... 438/488, 438/487, 798, 799, 463; 257/E21.482, E21.471, 257/E21.475, E21.483
See application file for complete search history.

(56) References Cited

U.S. PATENT DOCUMENTS

| 6,949,422 B2 * | 9/2005 | Kim .................. 438/166 |
| 2005/0170569 A1 * | 8/2005 | Yazaki et al. .......... 438/155 |

FOREIGN PATENT DOCUMENTS

CN           1649082 A        8/2005

* cited by examiner

*Primary Examiner*—Caridad M Everhart
(74) *Attorney, Agent, or Firm*—Haynes and Boone, LLP

(57) ABSTRACT

In a method of manufacturing a polysilicon thin film and a method of manufacturing a TFT having the thin film, a laser beam is irradiated on a portion of an amorphous silicon thin film to liquefy the portion of the amorphous silicon thin film. The amorphous silicon thin film is on a first end portion of a substrate. The liquefied silicon is crystallized to form silicon grains. The laser beam is shifted from the first end portion towards a second end portion of the substrate opposite the first end portion by an interval in a first direction. The laser beam is then irradiated onto a portion of the amorphous silicon thin film adjacent to the silicon grains to form a first polysilicon thin film. Therefore, electrical characteristics of the amorphous silicon thin film may be improved.

23 Claims, 19 Drawing Sheets

FIRST DIRECTION

FIRST DIRECTION

FIRST DIRECTION

FIRST DIRECTION

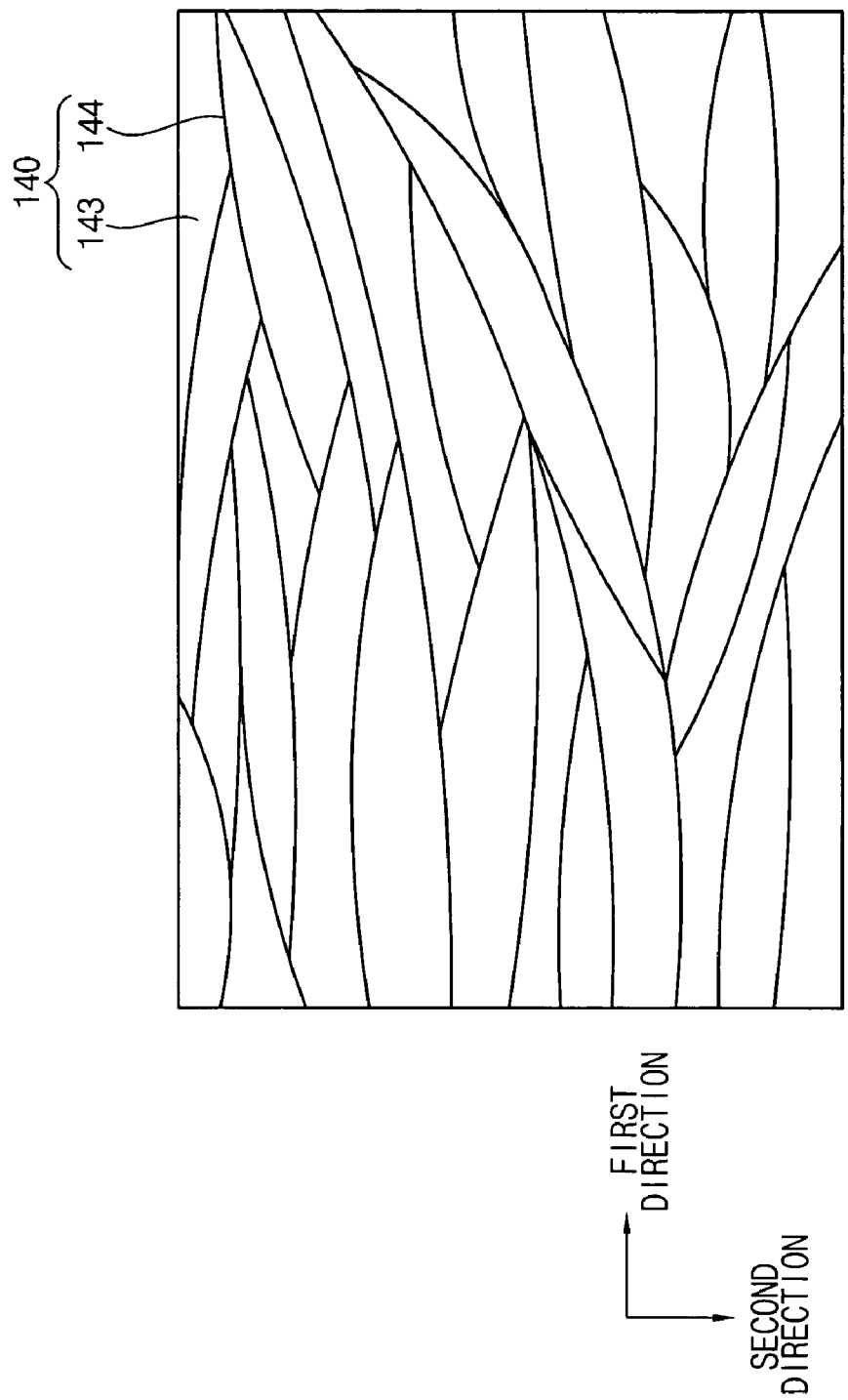

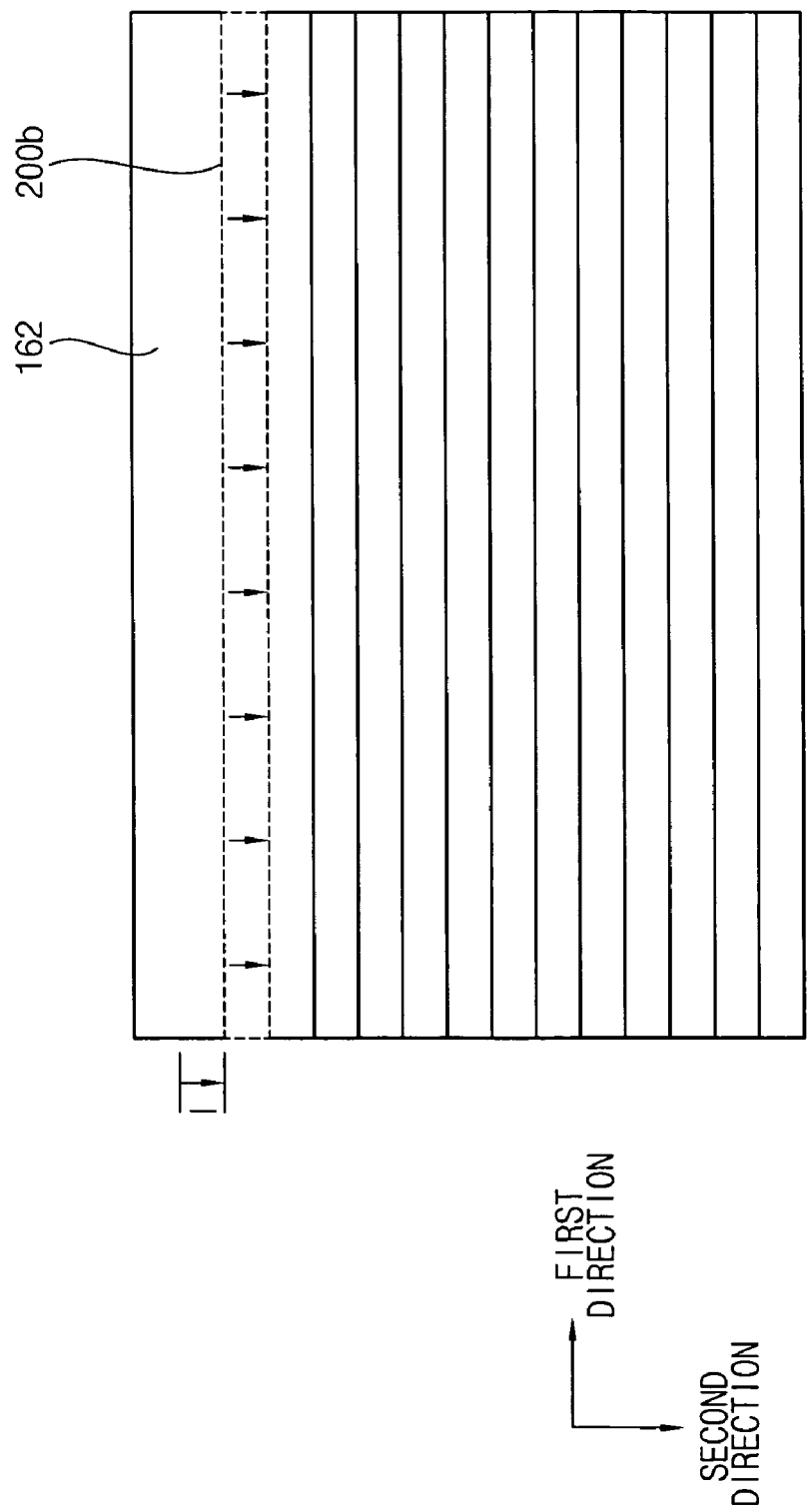

FIG. 13
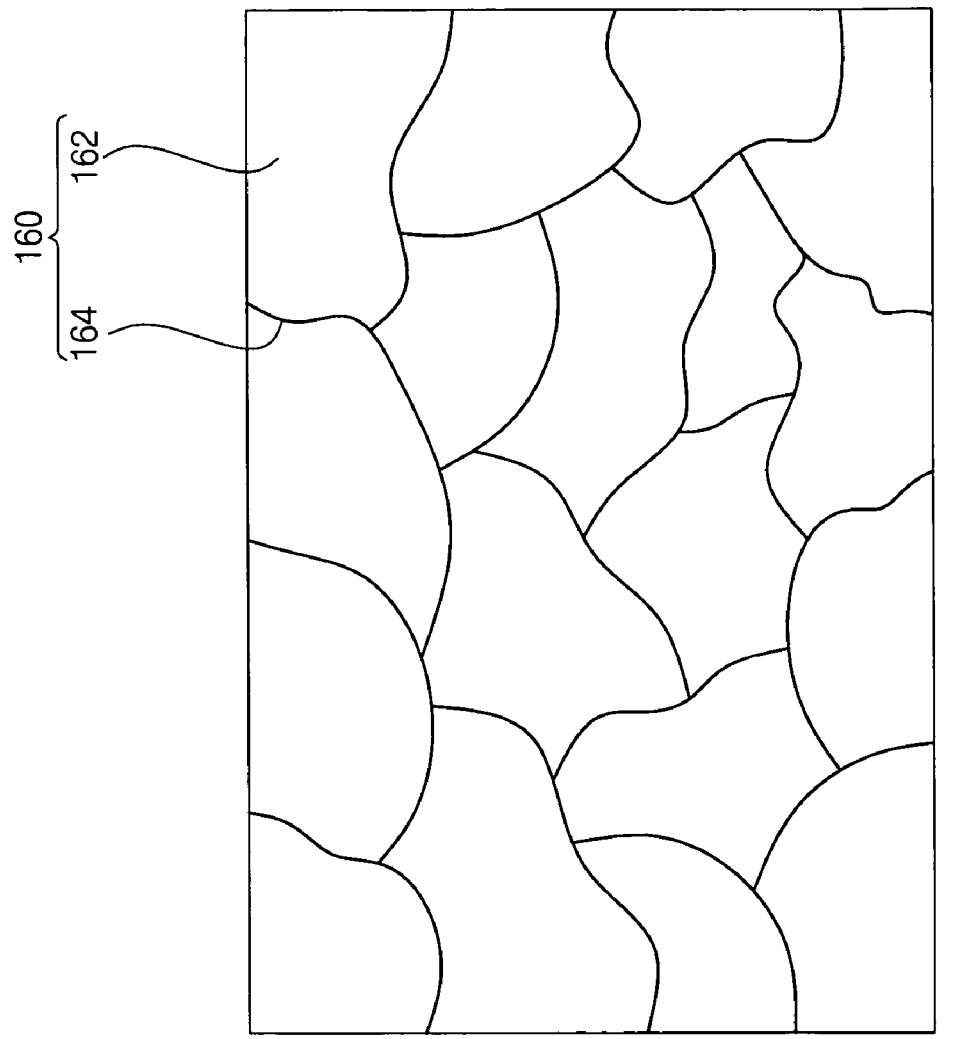
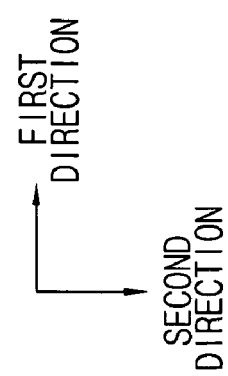

METHOD OF MANUFACTURING POLYSILICON THIN FILM AND METHOD OF MANUFACTURING THIN FILM TRANSISTOR HAVING THE SAME

CROSS-REFERENCE TO RELATED APPLICATIONS

This application relies for priority upon Korean Patent Application No. 2005-28628 filed on Apr. 6, 2005, Korean Patent Application No. 2005-28629 filed on Apr. 6, 2005, and Korean Patent Application No. 2005-28632 filed on Apr. 6, 2005, the contents of which are incorporated herein by reference in their entireties.

BACKGROUND

1. Field of the Invention

The present invention relates to a method of manufacturing a polysilicon thin film and a method of manufacturing a thin film transistor (TFT) having the thin film. More particularly, the present invention relates to a method of manufacturing a polysilicon thin film having improved electrical characteristics and a method of manufacturing a TFT having the thin film.

2. Description of the Related Art

A liquid crystal display (LCD) device includes a switching element. The switching element includes an amorphous silicon thin film transistor (a-Si TFT) or a polysilicon thin film transistor (poly-Si TFT). The LCD device having the poly-Si TFT has a faster operating speed than the LCD device having the a-Si TFT, thereby providing better image display quality than the LCD device having the a-Si TFT.

The poly-Si TFT is directly formed on a substrate, or an amorphous silicon thin film is crystallized to form the poly-Si TFT through heat treatment.

When a temperature of a glass substrate to be used for the LCD device rises above about 600° C., the glass substrate is deformed. This avoid this deformation, the amorphous silicon thin film is crystallized using an excimer laser. In the excimer laser annealing (ELA) process, a laser beam having a high energy is irradiated onto the amorphous silicon thin film for a period of tens of nanoseconds to crystallize the amorphous silicon thin film so that the glass substrate is not deformed.

When the amorphous silicon thin film is treated by the ELA process, silicon atoms in the amorphous silicon thin film are rearranged in a grain form to provide the poly-Si TFT with high electrical mobility. In the ELA process, the amorphous silicon thin film is melted and then solidified to form the poly-Si TFT. That is, the poly-Si TFT formed through the ELA process has high operating speed in a switched-on state.

However, a leakage current flows through an interface between polysilicon grains in a switched-off state. That is, silicon atoms at the interface are not securely combined with one another, causing an electron-hole to be formed at the interface, thereby generating a leakage current.

SUMMARY

In accordance with the present invention, a method of manufacturing a polysilicon thin film having improved electrical characteristics is provided.

In accordance with the present invention, a method of manufacturing a thin film transistor (TFT) having the above-mentioned thin film is also provided.

A method of manufacturing a polysilicon thin film in accordance with an embodiment of the present invention is provided as follows. A laser beam is irradiated on a first portion of an amorphous silicon thin film to liquefy the portion of the amorphous silicon thin film. The first portion of the amorphous silicon thin film is on a first end portion of a substrate. The liquefied silicon is crystallized to form silicon grains. The laser beam is shifted from the first end portion to a second end portion of the substrate opposite the first end portion by an interval in a first direction. The laser beam is then irradiated onto a second portion of the amorphous silicon thin film adjacent to the silicon grains to form a first polysilicon thin film.

A method of manufacturing a thin film transistor in accordance with an embodiment of the present invention is provided as follows. An amorphous silicon thin film is formed on a substrate. A laser beam is irradiated onto the amorphous silicon thin film to change the amorphous silicon thin film into a polysilicon thin film. The polysilicon thin film is partially etched to form a polysilicon pattern. A first insulating layer is formed on the substrate having the polysilicon pattern to protect the polysilicon pattern. A gate electrode is formed on the first insulating layer corresponding to the polysilicon pattern. A second insulating layer is formed on the first insulating layer and the gate electrode. The first and second insulating layers are partially etched to form contact holes. A source electrode and a drain electrode are formed on the second insulating layer. The source electrode is spaced apart from the drain electrode. The source and drain electrodes are electrically connected to the polysilicon pattern through the contact holes, respectively.

In accordance with the present invention, the laser beam is repetitively irradiated onto the substrate from the first end portion toward the second end portion to increase a grain size to form the poly-Si thin film having improved electrical characteristics.

BRIEF DESCRIPTION OF THE DRAWINGS

The above and other advantages of the present invention will become readily apparent by reference to the following detailed description when considered in conjunction with the accompanying drawings wherein:

FIG. 6 is a plan view showing a poly-Si thin film shown in FIG. 2;

FIGS. 12A to 12C are plan views showing the method shown in FIG. 11;

FIG. 13 is a plan view showing the poly-Si thin film formed by the method shown in FIG. 11.

DESCRIPTION OF THE EMBODIMENTS

Figure 1:
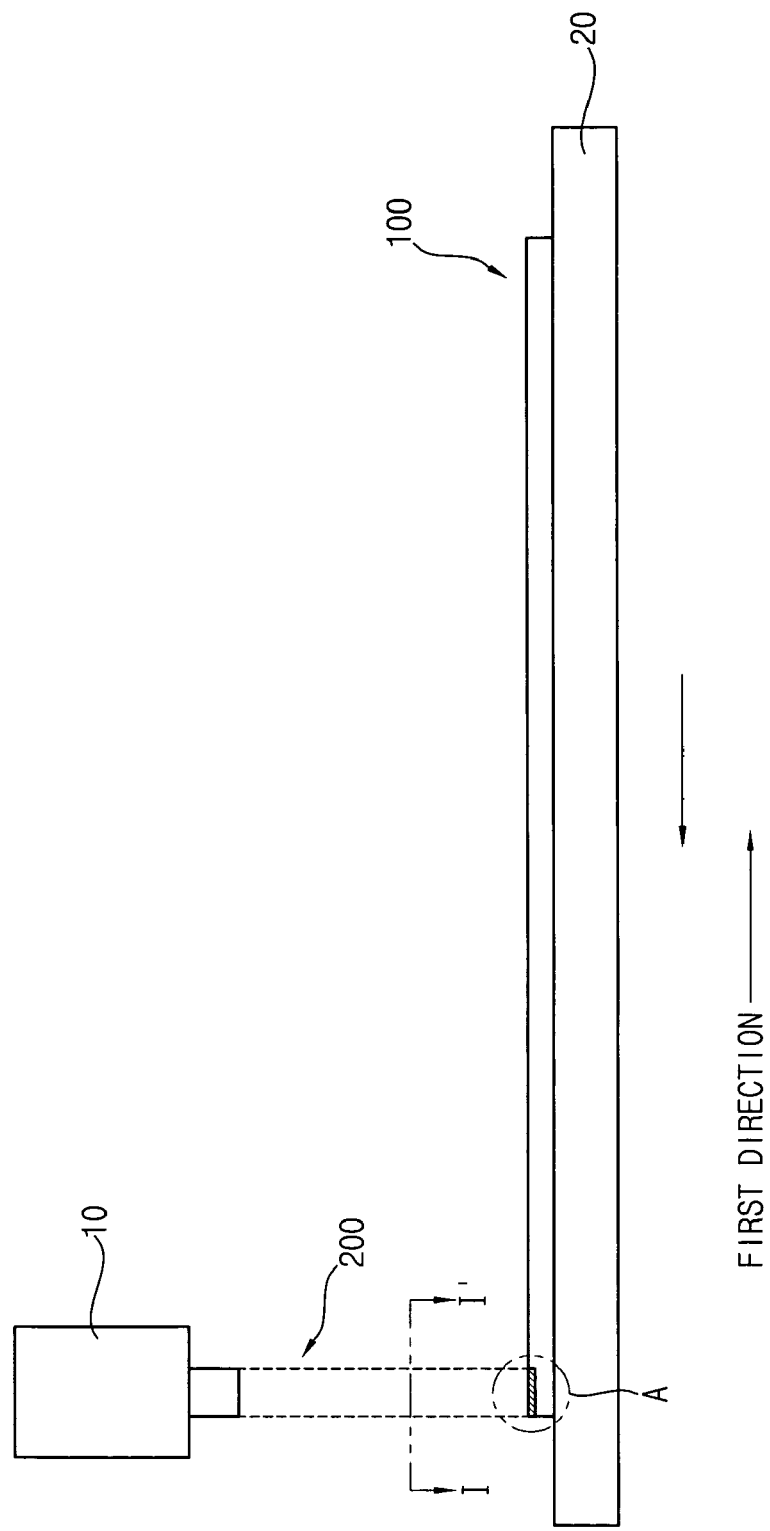
FIG. 1 is a cross-sectional view showing a method of manufacturing a polysilicon (poly-Si) thin film in accordance with one embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated ninety degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-sectional illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
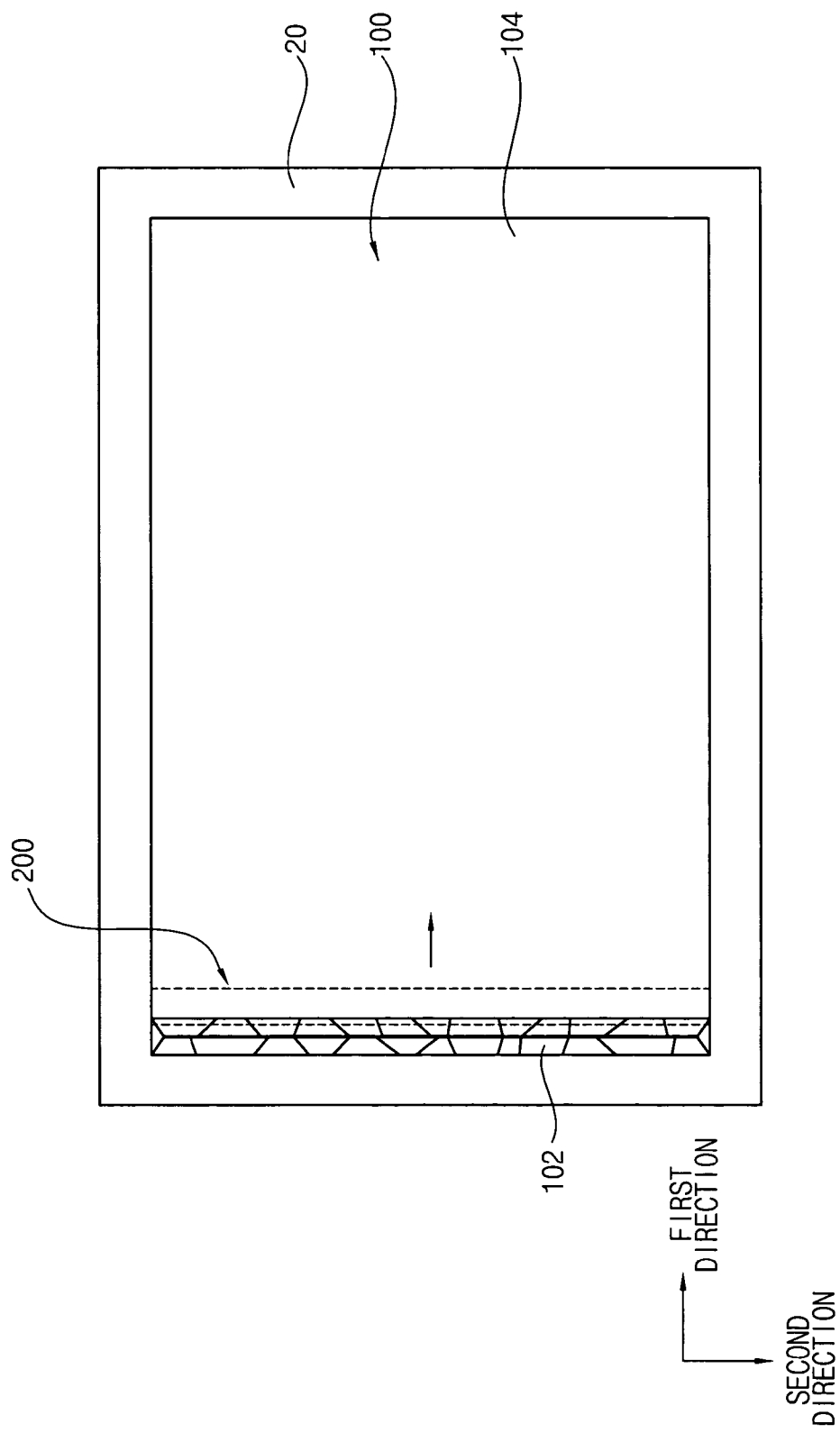
FIG. 2 is a plan view showing the method of manufacturing the poly-Si thin film shown in FIG. 1.
Figure 3:
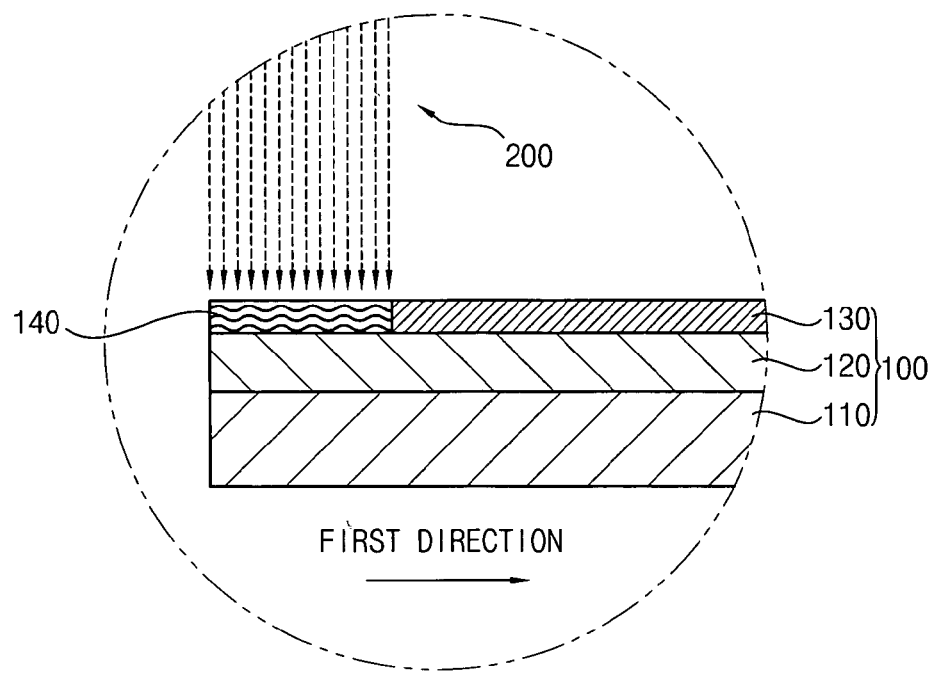
FIG. 3 is an enlarged cross-sectional view showing a portion 'A' shown in FIG. 1.

FIG. 1 is a cross-sectional view showing a method of manufacturing a polysilicon (poly-Si) thin film in accordance with one embodiment of the present invention. FIG. 2 is a plan view showing the method of manufacturing the poly-Si thin film shown in FIG. 1. FIG. 3 is an enlarged cross-sectional view showing a portion 'A' shown in FIG. 1.

Referring to FIGS. 1 to 3, an apparatus for manufacturing the poly-Si thin film 140 includes a laser unit 10, an XY-stage 20 and a substrate 100.

The laser unit 10 generates a laser beam 200 to intermittently irradiate the laser beam 200 onto the substrate 100. In the method shown in FIGS. 1 to 3, the laser unit 10 comprising an excimer laser that has various characteristics such as short wavelength, high output, high efficiency, etc. The excimer laser may comprise an inert gas excimer laser, an inert gas halide excimer laser, a mercury halide excimer laser, an inert gas oxide excimer laser or a polyatomic excimer laser. Examples of the inert gas include $Ar_2$, $Kr_2$, $Xe_2$, etc. Examples of the inert gas halide include ArF, ArCI, KrF, KrCI, XeF, XeCI, etc. Examples of the mercury halide include HgCl, HgBr, HgI, etc. Examples of the inert gas oxide include ArO, KrO, XeO, etc. Examples of the polyatomic material include $Kr_2F$, $Xe_2F$, etc.

A wavelength of the laser beam 200 generated from the laser unit 10 is about 200 nm to about 400 nm. In the method shown in FIGS. 1 to 3, the wavelength of the laser beam 200 generated from the laser unit 10 is about 250 nm to about 308 nm. A frequency of the laser beam 200 is about 300 Hz to about 6,000 Hz. In the method shown in FIGS. 1 to 3, the frequency of the laser beam 200 is a bout 4,000 Hz to about 6,000 Hz.

The XY-stage 20 supports the substrate 100, and repeatedly transports the substrate 100 in a first direction with respect to the substrate 100 by a first interval. In the method shown in FIGS. 1 to 3, the XY-stage 20 transports the substrate 100 from right to left, and the XY-stage 20 is shifted by the first interval in a first direction substantially perpendicular to the second direction with respect to the substrate 100.

As the XY-stage 20 transports the substrate 100, the laser beam 200 generated from the laser unit 10 is irradiated onto the substrate 100 from a first end portion 102 of the substrate 100 to a second end portion 104 of the substrate 100. The second end portion 104, which is adjacent to a right side of the substrate 100, is opposite the first end portion 102, which is adjacent to a left side of the substrate 100. Alternatively, the XY-stage 20 may transport the substrate 100 from left to right, and the XY-stage 20 may be shifted by the first interval in the first direction.

The substrate 100 is positioned on the XY-stage 20, and comprises a transparent substrate 110, an oxide layer 120 and an amorphous silicon (a-Si) thin film 130. In the method shown in FIGS. 1 to 3, a size of the substrate 100 is about 470 mm×360 mm.

The transparent substrate 110 is positioned on the XY-stage 20. The transparent substrate 110 comprises glass or quartz to transmit light. The oxide layer 120 is provided on the transparent substrate 110, and improves interfacial characteristics between the transparent substrate 110 and the a-Si thin film 130. The a-Si thin film 130 is deposited on the oxide layer 120 through a chemical vapor deposition (CVD) process. The a-Si thin film 130 comprises amorphous silicon.

The laser beam 200 generated from the laser 10 is irradiated onto the a-Si thin film 130 so that the a-Si thin film 130 is rapidly melted. In FIGS. 1 to 3, the a-Si thin film 130 onto which the laser beam 200 is irradiated is fully melted, while remaining portions of the a-Si thin film 130 onto which the laser beam 200 is not irradiated remain in a solid state. The melted a-Si thin film 130 is rapidly crystallized through a solid phase crystallization to form a polysilicon (poly-Si) thin film 140.

Figure 4A:
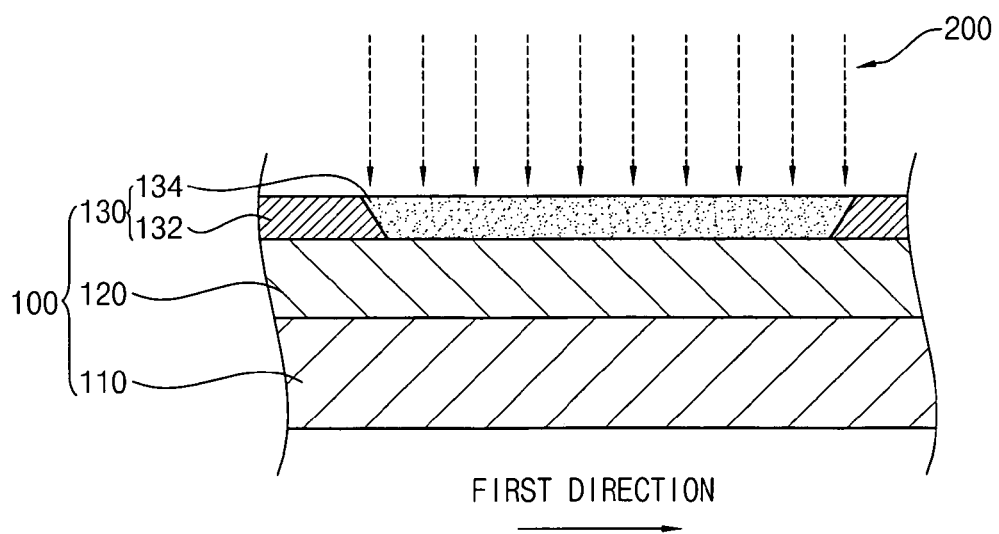
FIGS. 4A to 4F are cross-sectional views showing the growth of the poly-Si shown in FIG. 2.

FIGS. 4A to 4F are cross-sectional views showing a growth of the poly-Si shown in FIG. 2. In particular, FIG. 4A is a cross-sectional view showing a first liquefaction of a portion of the a-Si thin film.

Referring to FIG. 4A, the laser unit 10 that generates the laser beam 200 is prepared on the a-Si thin film 130 that is provided on the substrate 100. The substrate 100 is positioned on the XY-stage 20. The laser beam 200 may have a beam shape such as an elliptical shape, a quadrangular shape, etc. A first width of the beam shape of the laser beam 200 is shorter than a second width of the beam shape of the laser beam 200. The second width of the beam shape of the laser beam 200 may be substantially equal to a side length of the substrate 100. In FIG. 4A, the first width of the beam shape of the laser beam 200 is more than twice the width of a unit poly-Si crystal formed by each of transportations of the substrate 100.

The laser beam 200 generated from the laser unit 10 is firstly irradiated onto a portion of the a-Si thin film 130 adjacent to the first end portion 102 of the substrate to firstly liquefy the portion of the a-Si thin film 130, thereby forming the liquefied silicon region 134. That is, a phase of the a-Si thin film 130 is changed from an amorphous solid phase to a liquid phase. The portion of the a-Si thin film 130 onto which the laser beam 200 is firstly irradiated is fully liquefied. Remaining portions of the a-Si thin film 130 remain in the amorphous solid phase.

In FIG. 4A, an intensity of a unit shot of the laser beam 200 is enough to fully liquefy the a-Si thin film 130. Alternatively, the intensity of the unit shot of the laser beam 200 may be smaller than that for liquefying the a-Si thin film 130, and a plurality of shots of the laser beam 200 may be irradiated onto the portion of the a-Si thin film 130 to fully liquefy the a-Si thin film 130.

Figure 4B:
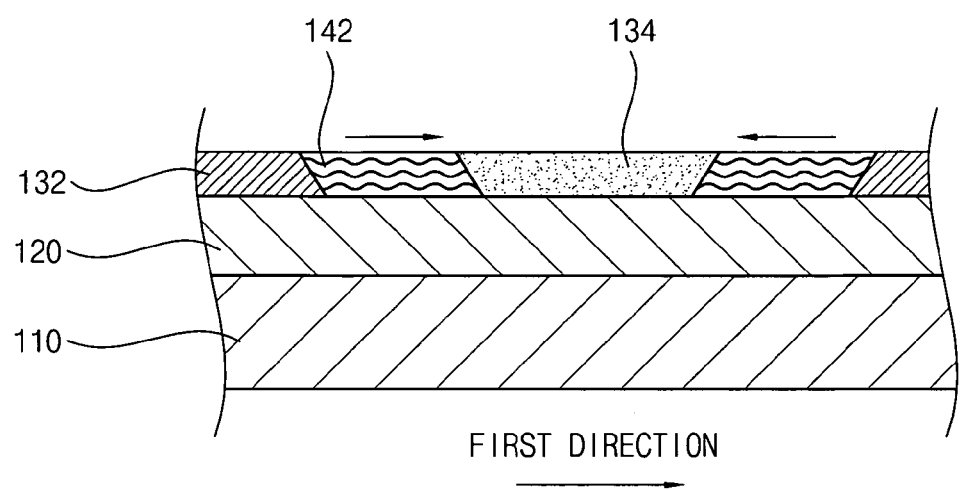

FIG. 4B is a cross-sectional view showing a crystal growth adjacent to sides of the firstly liquefied silicon region.

Referring to FIG. 4B, the firstly liquefied silicon region 134 is firstly crystallized from the sides of the firstly liquefied silicon region 134 through solid phase crystallization. The firstly crystallized poly-Si 142 adjacent to the sides that are interfaces between the remaining portion of the a-Si thin film 132 and the firstly liquefied silicon region 134 functions as a core of the crystal growth. That is, the remaining portion of the a-Si 132 functions as the core of the crystal growth so that the liquefied silicon region 134 is firstly crystallized from sides of the firstly liquefied silicon region 134 to a center of the firstly liquefied silicon region 134 by a lateral growth width of about a half of the first width of the beam shape of the laser beam 200. In FIG. 4B, the lateral growth width is about 1 μm to about 5 μm. For example, the lateral growth width may be about 2 μm to about 4 μm.

Figure 4C:
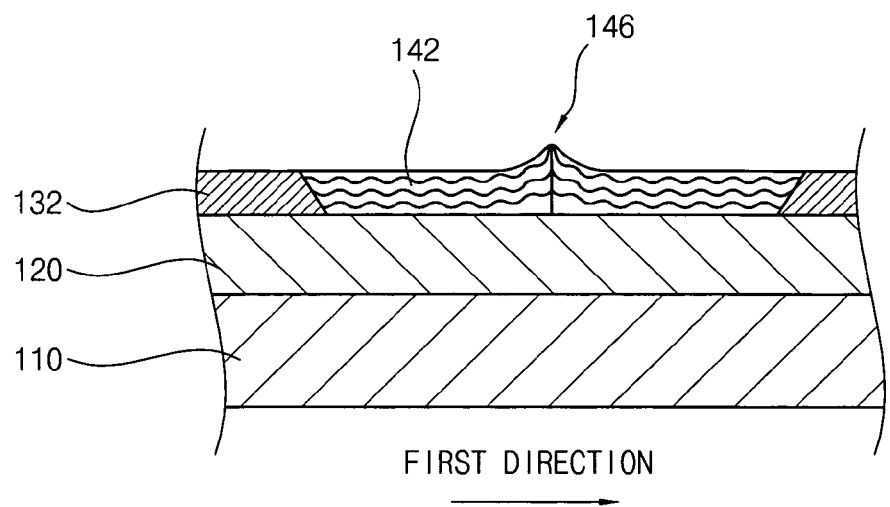

FIG. 4C is a cross-sectional view showing a protruding portion in the center of the firstly crystallized poly-Si.

Referring to FIG. 4C, when the first crystallization of the firstly liquefied silicon region 134 is completed, the protruding portion 146 is formed on the center of the firstly crystallized poly-Si 142. The lateral growths from the sides meet at the center of the firstly crystallized poly-Si 142. An electrical mobility of the protruding portion 146 is lower than remaining portion of the firstly crystallized poly-Si 142. In order to make the electrical mobility of the poly-Si thin film more uniform, the protruding portion 146 is removed by following the processes.

Figure 4D:
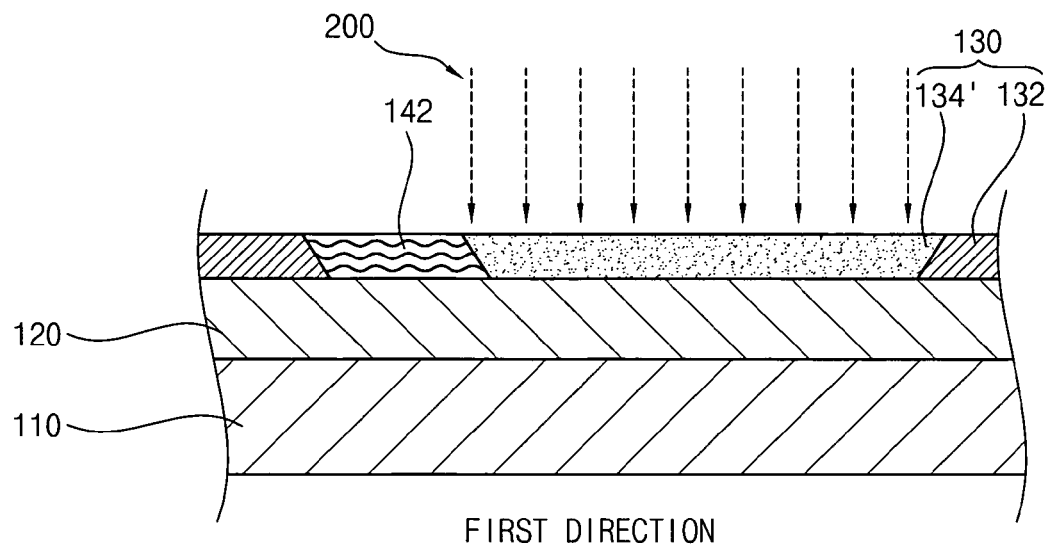

FIG. 4D is a cross-sectional view showing a secondly liquefying of another portion of the a-Si thin film adjacent to the firstly liquefied silicon region.

Referring to FIG. 4D, the laser unit 10 is shifted by the first interval from the first end portion 102 toward the second end portion 104. The laser beam 200 generated from the laser unit 10 is secondly irradiated onto a portion of the a-Si thin film 130, a portion of the firstly crystallized poly-Si 142 and the firstly protruding portion 146 adjacent to the first end portion 102 of the substrate 100. The irradiation by the laser beam 200 secondly liquefies the portion of the a-Si thin film 130, the portion of the firstly crystallized poly-Si 142 and the firstly protruding portion 146 to form the secondly liquefied silicon region 134'. The portion of the a-Si thin film 130 onto which the laser beam 200 is secondly irradiated is fully liquefied. The melting of the firstly protruding portion 146 causes the surface of the firstly crystallized poly-Si 142 to planarize, thereby eliminating the protruding portion 146. In FIG. 4D, the first interval is more than the half of the width of the firstly crystallized poly-Si 132.

Figure 4E:
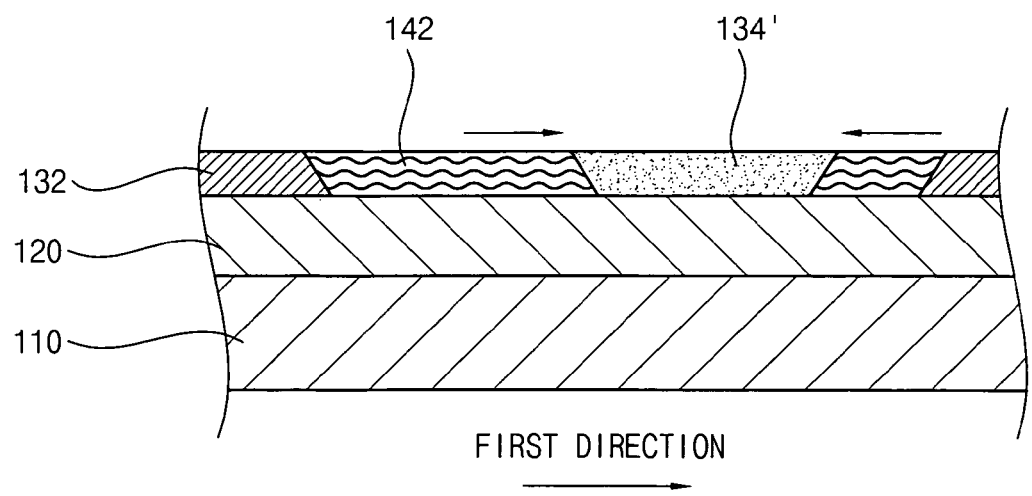

FIG. 4E is a cross-sectional view showing a crystal growth adjacent to sides of the secondly liquefied silicon region 134'.

Referring to FIG. 4E, the secondly liquefied silicon region 134' is secondly crystallized from the sides of the secondly liquefied silicon region 134' through solid phase crystallization. The secondly crystallized poly-Si 142' adjacent to the sides that are interfaces between the remaining portion of the firstly crystallized poly-Si 142 and the secondly liquefied silicon region 134' and an interface between the remaining portion of the a-Si thin film 132 and the secondly liquefied silicon region 134' functions as a core of the crystal growth. That is, a long a first side, crystal growth is formed from the firstly crystallized poly-Si 142 so that the secondly liquefied silicon region 134' is secondly crystallized from the interface between the remaining portion of the firstly crystallized poly-Si 142 and the secondly liquefied silicon region 134'. Along a second side opposite the first side, the a-Si thin film 132 functions as the core of the crystal growth so that the secondly liquefied silicon region 134' is secondly crystallized from the interface between the remaining portion of the a-Si thin film 132 and the secondly liquefied silicon region 134' by a lateral growth width of about a half of the first width of the beam shape of the laser beam 200.

Figure 4F:
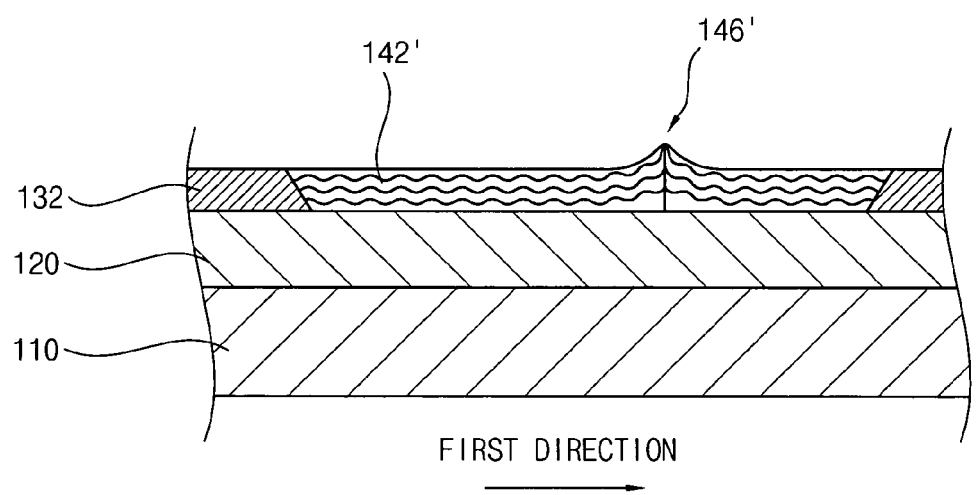

FIG. 4F is a cross-sectional view showing a protruding portion on a center of the secondly liquefied silicon region.

Referring to FIG. 4F, when the second crystallization of the secondly liquefied silicon region 134' is completed, the second protruding portion 146' is formed on the secondly crystallized poly-Si 142'.

The laser unit 10 is again shifted to irradiate the laser beam 200 onto a portion of the a-Si thin film 130, a portion of the secondly crystallized poly-Si (not shown) and the second protruding portion 146' to thirdly liquefy the portion of the a-Si thin film 130 and the portion of the secondly crystallized poly-Si 142' to form the liquefied silicon region 134, and eliminate the second protruding portion 146'. The portion of the a-Si thin film 130 onto which the laser beam 200 is thirdly irradiated is fully liquefied. The above-described processes are repeated across the surface of the substrate 100 to form the poly-Si thin film 140 having increased electrical mobility.

Figure 5A:
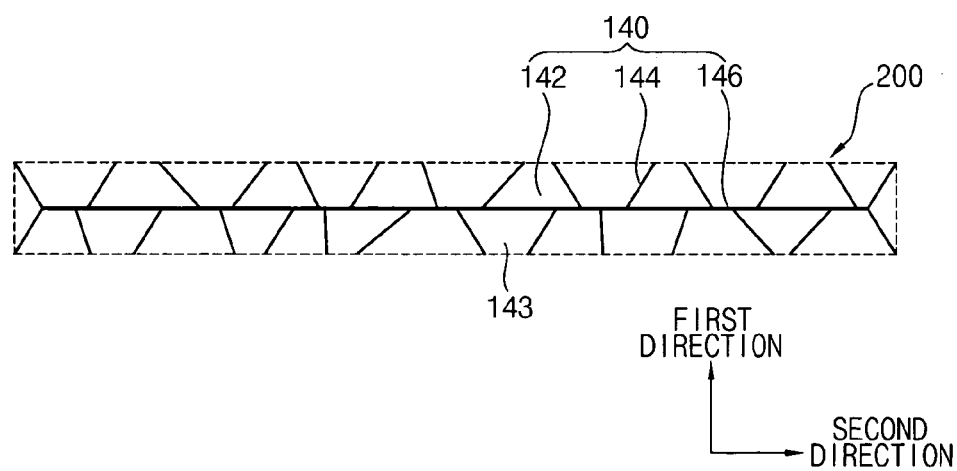
FIGS. 5A to 5C are plan views showing the growth of the poly-Si shown in FIG. 2.
Figure 5B:
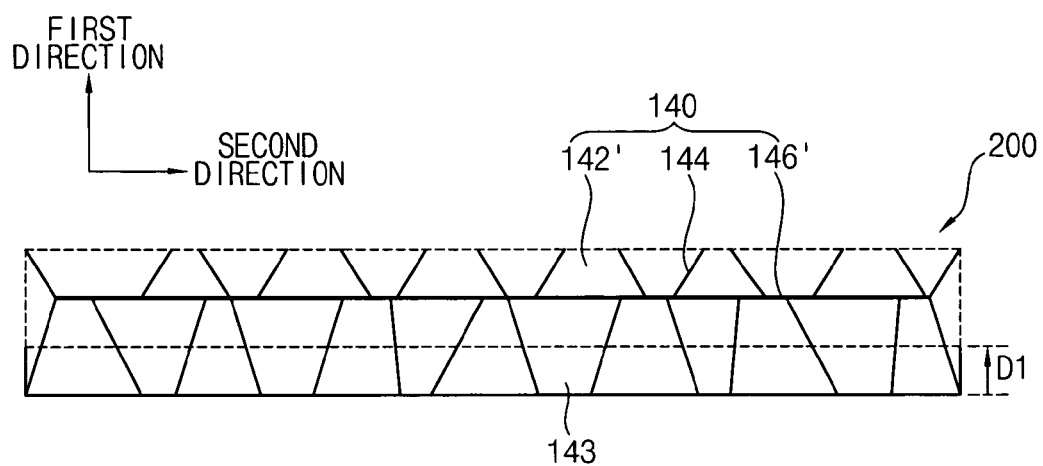
Figure 5C:
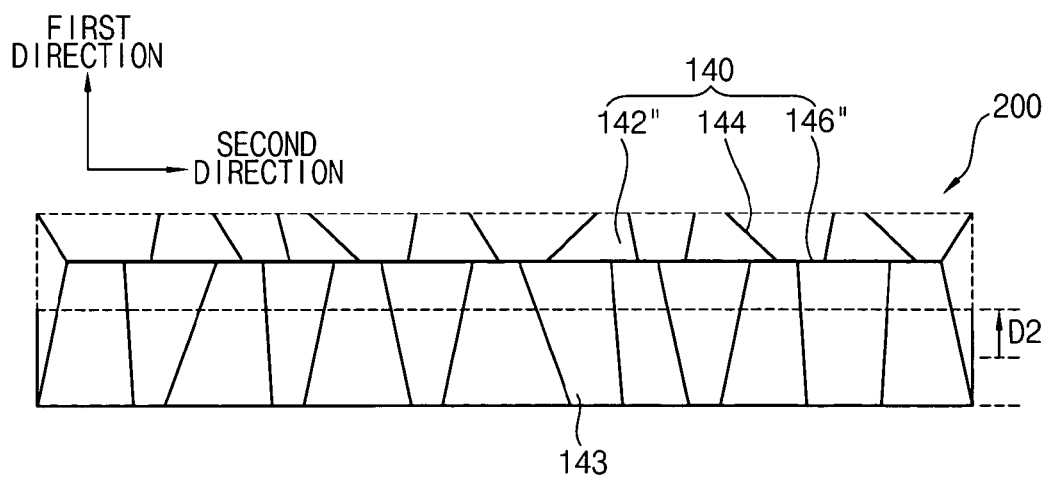

FIGS. 5A to 5C are plan views showing the growth of the poly-Si shown in FIG. 2. In particular, FIG. 5A is a plan view showing the poly-Si thin film formed by the first irradiation of the laser beam.

Referring to FIG. 5A, the laser beam 200 generated from the laser unit 10 is irradiated onto the portion of the a-Si thin film 130. The portion of the a-Si thin film 130 is rapidly liquefied to form the liquefied silicon region 134, and crystallized from the sides of the liquefied silicon region 134 through the solid phase crystallization.

In the solid phase crystallization, the a-Si thin film 130 at the sides of the liquefied silicon region 134 functions as the core of the crystal growth. The firstly crystallized poly-Si 142 grows from the core to form a plurality of silicon grains 143. Silicon grain boundaries 144 are defined by adjacent silicon grains 143.

When the silicon grains 143 grow through the solid phase crystallization, the firstly protruding portion 146 is formed on the center of the firstly crystallized poly-Si 142. In FIG. 5A, the firstly protruding portion 146 extends in the second direction.

FIG. 5B is a plan view showing the poly-Si thin film formed by the second irradiation of the laser beam.

Referring to FIGS. 4D and 5B, the laser unit 10 is shifted by the first interval D1 in the first direction from the first end portion 102 toward the second end portion 104. The laser beam 200 generated from the laser unit 10 is secondly irradiated onto the portion of the a-Si thin film 130, the portion of the firstly crystallized poly-Si 142 and the firstly protruding portion 146 to secondly liquefy the portion of the a-Si thin film 130, the portion of the firstly crystallized poly-Si 142 and the firstly protruding portion 146 to form the secondly liquefied silicon region, and eliminate the firstly protruding portion 146. The portion of the a-Si thin film 130 onto which the laser beam 200 is secondly irradiated is fully liquefied. In FIGS. 4D and 5B, the first interval D1 is no more than the half of the first width of the beam shape of the laser beam 200, which ensures that the laser beam 200 will fully liquefy the protruding portion formed by the previous irradiation. For example, the first interval D1 of the laser beam 200 is about 1 μm to about 4 μm.

When the laser beam 200 is overly irradiated onto the a-Si thin film 130, the a-Si thin film 130 separate from the oxide layer 120. In order to prevent the separation of the a-Si thin film 130, an overlapped area between the firstly irradiated laser beam and the secondly irradiated laser beam is no more than about 90% of an area of the laser beam 200.

When the laser beam 200 generated from the laser unit 10 is secondly irradiated onto the portion of the a-Si thin film 130, the portion of the firstly crystallized poly-Si 142,, the portion of the a-Si thin film 130, the portion of the firstly crystallized poly-Si 142 and the firstly protruding portion 146 are secondly liquefied to form the secondly liquefied silicon region 134'. In addition, the firstly protruding portion 146 is eliminated by the melting of the a-Si thin film 130. The portion of the a-Si thin film 130 is on a right side of the laser beam 200, and the portion of the firstly crystallized poly-Si 142 is on a left side of the laser beam 200.

The secondly liquefied silicon region 134' is secondly crystallized from the interface between the remaining portion of the firstly crystallized poly-Si 142 and the secondly liquefied silicon region 134' so that the silicon grains 143 grow toward a central portion of the laser beam 200. In addition, the secondly liquefied silicon region 134' is secondly crystallized from the interface between the remaining portion of the a-Si thin film 132 and the secondly liquefied silicon region 134'. When the second crystallization of the secondly liquefied silicon region 134' is completed, the second protruding portion 146' is formed on the secondly crystallized poly-Si 142' along the center of the laser beam 200.

FIG. 5C is a plan view showing the poly-Si thin film formed by the third irradiation of the laser beam.

Referring to FIG. 5C, the laser unit 10 is shifted by a second interval D2 in the first direction from the first end portion 102 toward the second end portion 104. The laser beam 200 generated from the laser unit 10 is thirdly irradiated onto a portion of the a-Si thin film 130 shown in FIG. 4D, a portion of the secondly crystallized poly-Si 142' and the secondly protruding portion 146' to thirdly liquefy the portion of the a-Si thin film 130 shown in FIG. 4D, the portion of the secondly crystallized poly-Si 142' and the secondly protruding portion 146' to form the thirdly liquefied silicon region (not shown), and eliminate the secondly protruding portion 146'. The portion of the a-Si thin film 130 shown in FIG. 4D onto which the laser beam 200 is thirdly irradiated is fully liquefied. The second interval D2 is no more than the half of the first width of the beam shape of the laser beam 200. In FIG. 5C, the second interval D2 is substantially equal to the first interval D1.

When the laser beam 200 generated from the laser unit 10 is thirdly irradiated onto the portion of the a-Si thin film 130 shown in FIG. 4D, the portion of the secondly crystallized poly-Si 142', the portion of the a-Si thin film 130 shown in FIG. 4D, the portion of the secondly crystallized poly-Si 142' and the secondly protruding portion 146' are thirdly liquefied to form the thirdly liquefied silicon region (not shown). In addition, the secondly protruding portion 146' is eliminated. The portion of the a-Si thin film 130 shown in FIG. 4D is on a right side of the laser beam 200, and the portion of the secondly crystallized poly-Si 142' is on a left side of the laser beam 200. The thirdly liquefied silicon region (not shown) is thirdly crystallized from the interface between the remaining portion of the secondly crystallized poly-Si 142' and the thirdly liquefied silicon region (not shown) so that the silicon grains 143 grow toward a central portion of the laser beam 200. In addition, the thirdly liquefied silicon region (not shown) is thirdly crystallized from the interface between the remaining portion of the a-Si thin film 132 shown in FIG. 4D and the thirdly liquefied silicon region (not shown). When the third crystallization of the thirdly liquefied silicon region (not shown) is completed, the third protruding portion 146" is formed on the thirdly crystallized poly-Si 142" along the center of the laser beam 200.

The generation and elimination of the protruding portions 146, 146' and 146" are repeated so that the silicon grains 143 grow in the first direction across the surface of the substrate 100. Therefore, the poly-Si thin film 140 having increased electrical mobility is formed.

FIG. 6 is a plan view showing a poly-Si thin film shown in FIG. 2.

Referring to FIG. 6, the poly-Si thin film 140 includes the silicon grains 143 and the silicon grain boundaries 144.

The silicon grains 143 extend in the first direction from a left side to a right side of the substrate. The silicon grain boundaries 144 also extend in a direction that is substantially in parallel with the silicon grains 143. Electrons may not flow through the silicon grain boundaries 144 so that an electrical mobility of the poly-Si thin film 140 in the first direction is greater than an electrical mobility of the poly-Si thin film 140 in the second direction. That is, the electrons or holes may be trapped at the silicon grain boundaries 144.

Figure 7:
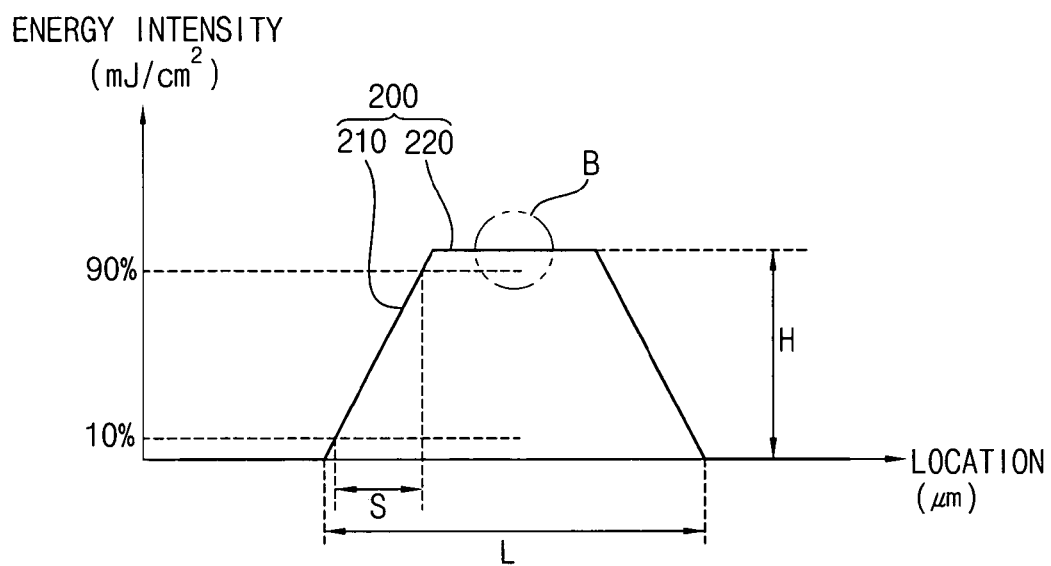
FIG. 7 is a graph showing a relationship between an intensity of a laser beam and a location.
Figure 8:
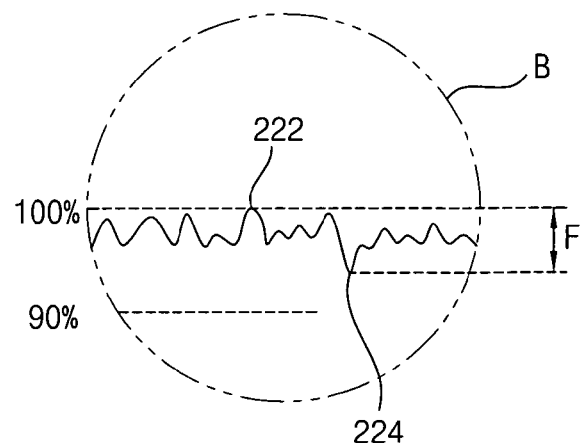
FIG. 8 is a graph showing a portion 'B' of FIG. 7.

FIG. 7 is a graph showing a relationship between an energy intensity of a laser beam and a location. The location is a horizontal length of a predetermined point on a surface on which the laser beam is irradiated. FIG. 8 is a graph showing a portion 'B' of FIG. 7.

Referring to FIGS. 7 and 8, an energy profile of the laser beam 200 generated from the laser unit 10 includes a flat portion 220 and two inclined portions 210. The flat portion 220 has a substantially constant energy distribution. Each of the inclined portions 210 has an inclined energy distribution. The flat portion 220 is between the inclined portions 210.

The second width of the beam shape of the laser beam 200 is substantially equal to the side length of the substrate 100. For example, when the size of the substrate 100 is about 470 mm×360 mm, the second width of the beam shape of the laser beam 200 may be about 470 mm or about 360 mm.

When the first width L of the beam shape of the laser beam 200 is shorter than about 3 μm, the laser beam 200 may be incontrollable. In addition, when the first width L of the beam shape of the laser beam 200 is too wide, the width of the liquefied silicon region 134 is too wide to form micro-crystals in the silicon grains. The first width L of the beam shape of the laser beam 200 is about 3 μm to about 10 μm.

The energy intensity of the flat portion is about 400 mJ/cm$^2$ to about 1,000 mJ/cm$^2$. When the energy intensity of the flat portion is less than about 400 mJ/cm$^2$, the laser beam 200 may be unable to liquefy the a-Si thin film 130. When the energy intensity of the flat portion is more than about 1,000 mJ/cm$^2$, the laser beam 200 melts too large portion of the a-Si thin film 130 so that the a-Si thin film 130 may be separated from the oxide layer 120.

An inclination S of the inclined portion is no more than about 10 μm. The inclination S of the inclined portion is no more than about 3 μm. The inclination S is a horizontal width between about 10% of the energy intensity of the flat portion 220 and about 90% of the energy intensity of the flat portion 220. The inclination S of the inclined portion 210 is a ratio of the energy intensity of the laser beam 200 to a width of the inclined portion 210. The inclination S is determined between about 10% of the energy intensity of the flat portion 220 and about 90% of the energy intensity of the flat portion 220. A maximum energy intensity H corresponds to the energy intensity of the flat portion 220. When the inclination S of the inclined portion 210 is more than about 10 μm, a uniformity of the energy intensity of the laser beam 200 is decreased so that a crystal growth of the silicon grains may be deteriorated.

A variation F of the energy intensity of the flat portion 210 is no more than about 5% of a maximum energy intensity 222 of the flat portion 210. That is, a difference between the maximum energy intensity 222 of the flat portion 210 and a minimum energy intensity 224 of the flat portion 210 is no more than about 5%. When the variation F of the energy intensity is more than about 5%, the uniformity of the energy intensity of the laser beam 200 is deteriorated, and microcrystals may remain in the liquefied silicon region.

The laser beam 200 is repetitively irradiated onto the a-Si thin film 130, and is shifted by the interval to form the poly-Si thin film 140 having silicon grains 143 of increased sizes.

Figure 9A:
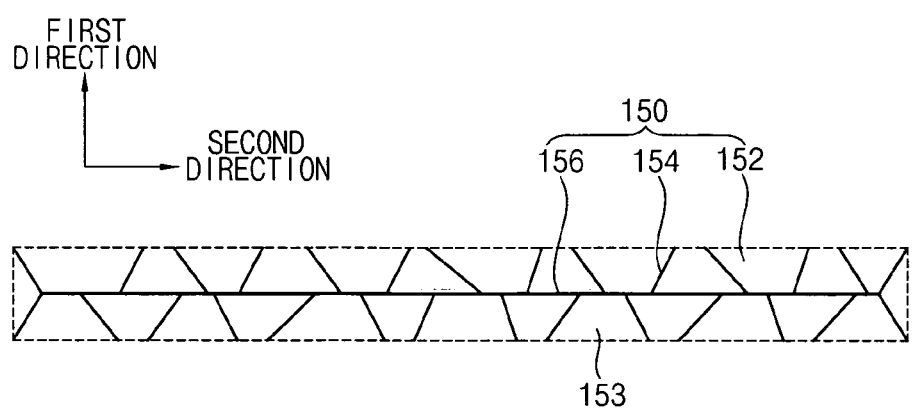
FIGS. 9A to 9C are plan views showing a growth of a poly-Si formed by a method of manufacturing a thin film in accordance with another embodiment of the present invention.
Figure 9B:
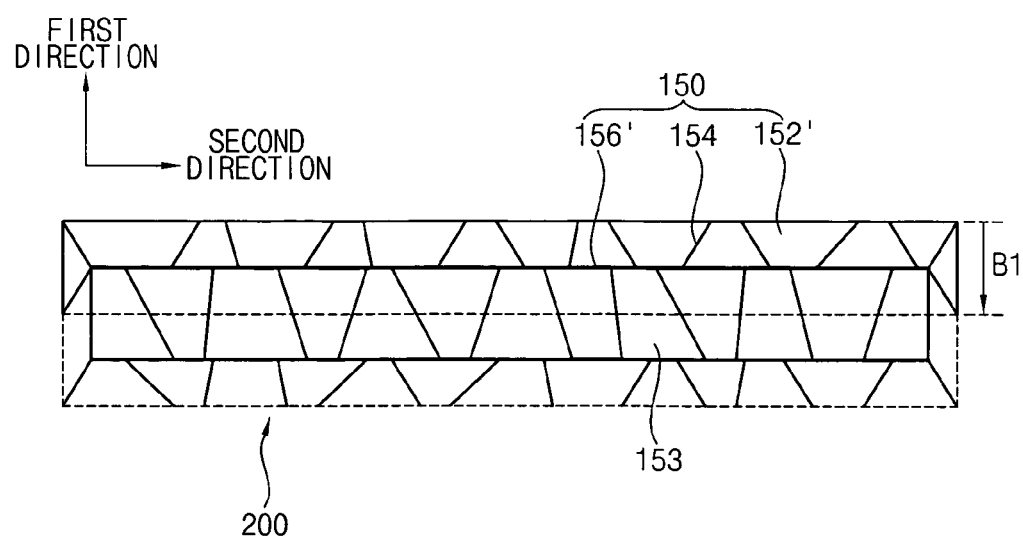
Figure 9C:
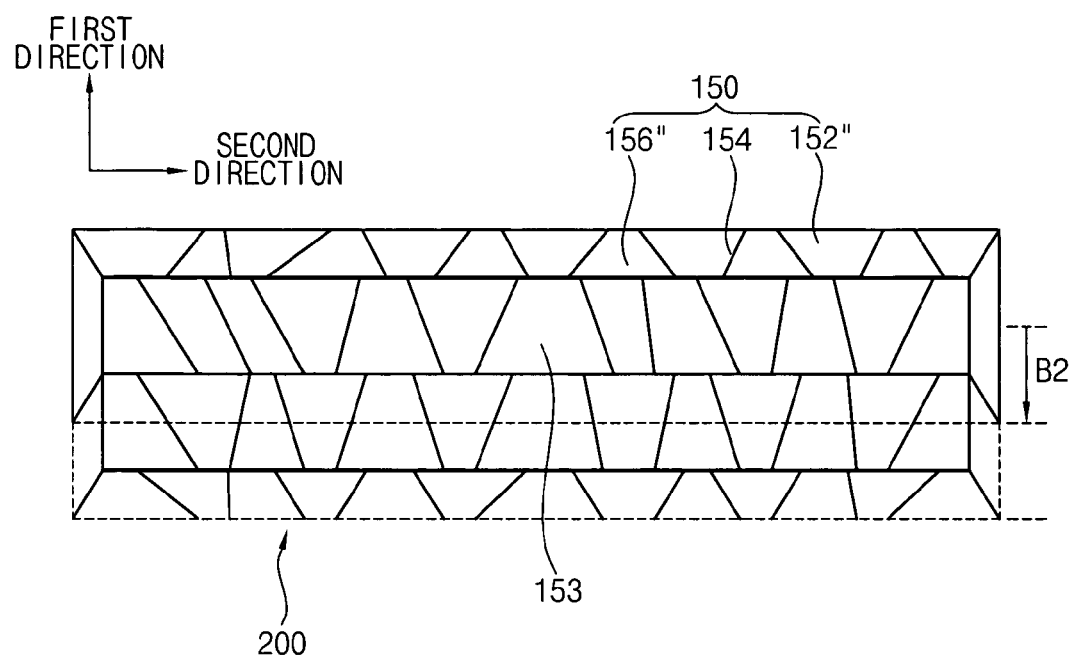

FIGS. 9A to 9C are plan views showing a growth of a poly-Si formed by a method of manufacturing a thin film in accordance with another embodiment of the present invention. The method of manufacturing the thin film of FIGS. 9A to 9C is substantially the same as in FIGS. 1 to 8, except for the poly-Si thin film. Thus, the same reference numerals will be used to refer to the same or like parts as those described in FIGS. 1 to 8 and any further explanation concerning the above elements will be omitted.

FIG. 9A is a plan view showing the poly-Si thin film formed by a first irradiation of a laser beam.

Referring to FIG. 9A, the laser beam 200 generated from a laser unit 10 is irradiated onto a portion of an a-Si thin film (not shown). The a-Si thin film (not shown) is provided on a substrate. The portion of the a-Si thin film (not shown) is rapidly liquefied to form a liquefied silicon region (not shown), and crystallized from sides of the liquefied silicon region (not shown) through solid phase crystallization. The portion of the a-Si thin film (not shown) onto which the laser beam 200 is firstly irradiated is fully liquefied.

In the solid phase crystallization, the a-Si thin film (not shown) at the sides of the liquefied silicon region (not shown) functions as a core of the crystal growth.

The firstly crystallized poly-Si 152 grows from the core to form a plurality of silicon grains 153. The silicon grain boundaries 154 are defined by adjacent silicon grains 153.

When the silicon grains 153 grow through the solid phase crystallization, a firstly protruding portion 156 is formed on a center of the firstly crystallized poly-Si 152. In FIG. 9A, the firstly protruding portion 156 extends in the second direction.

FIG. 9B is a plan view showing the poly-Si thin film formed by a second irradiation of the laser beam.

Referring to FIG. 9B, the laser unit 10 is shifted by a third interval B1 from a second end portion of the substrate toward a first end portion of the substrate. When the laser unit 10 is shifted in the opposite direction to the direction of FIG. 2, sizes of the poly-Si crystals may be uniformized, and mobility of electrons in various directions may also be uniformized. The laser beam 200 generated from the laser unit 10 is secondly irradiated onto a portion of the a-Si thin film (not shown) and a portion of the firstly crystallized poly-Si 152 to secondly liquefy the portion of the a-Si thin film (not shown) and the portion of the firstly crystallized poly-Si 152 to form a secondly liquefied silicon region (not shown). In this embodiment, the firstly protruding portion 156 remains. The portion of the a-Si thin film (not shown) onto which the laser beam 200 is secondly irradiated is fully liquefied. In FIG. 9B, the third interval B1 is more than a half of a first width of a beam shape of the laser beam 200.

When the laser beam 200 generated from the laser unit 10 is secondly irradiated onto the portion of the a-Si thin film (not shown) and the portion of the firstly crystallized poly-Si 152, the portion of the a-Si thin film (not shown) and the portion of the firstly crystallized poly-Si 152 are secondly liquefied to form the secondly liquefied silicon region (not shown). The firstly protruding portion 156 is not eliminated. The portion of the a-Si thin film (not shown) is on one side of the laser beam 200, and the portion of the firstly crystallized poly-Si 152 is on an opposite side of the laser beam 200. The one side and the opposite side of the laser beam 200 corresponds to a left side and a right side of the laser beam, as viewed in the perspective shown in FIG. 1.

The secondly liquefied silicon region (not shown) is secondly crystallized from an interface between a remaining portion of the firstly crystallized poly-Si 152 and the secondly liquefied silicon region (not shown) so that the silicon grains 153 grow toward a central portion of the laser beam 200. In addition, the secondly liquefied silicon region (not shown) is secondly crystallized from the interface between the remaining portion of the a-Si thin film (not shown) and the secondly liquefied silicon region (not shown). When the second crystallization of the secondly liquefied silicon region (not shown) is completed, the second protruding portion 156' is formed on the secondly crystallized poly-Si 152' along a center of the laser beam 200. In FIG. 9B, the second protruding portion 156' is substantially in parallel with the first protruding portion 156.

FIG. 9C is a plan view showing the poly-Si thin film formed by a third irradiation of the laser beam.

Referring to FIG. 9C, the laser unit 10 is shifted by a fourth interval B2 from the second end portion toward the first end portion. The laser beam 200 generated from the laser unit 10 is thirdly irradiated onto a portion of the a-Si thin film (not shown) and a portion of the secondly crystallized poly-Si 152' to thirdly liquefy the portion of the a-Si thin film (not shown) and the portion of the secondly crystallized poly-Si 152'. This forms a thirdly liquefied silicon region (not shown), while the secondly protruding portion 156' remains. The fourth interval B2 is more than the half of the first width of the beam shape of the laser beam 200. In FIG. 9C, the fourth interval B2 is substantially equal to the third interval B1.

When the laser beam 200 generated from the laser unit 10 is thirdly irradiated onto the portion of the a-Si thin film (not shown) and the portion of the secondly crystallized poly-Si 152', the portion of the a-Si thin film (not shown) and the portion of the secondly crystallized poly-Si 152' are thirdly liquefied to form a thirdly liquefied silicon region (not shown). In addition, the secondly protruding portion 156' is not eliminated. The portion of the a-Si thin film (not shown) is on a left side of the laser beam 200, and the portion of the secondly crystallized poly-Si 152' is on a right side of the laser beam 200, as viewed in the perspective shown in FIG. 1. The thirdly liquefied silicon region (not shown) is thirdly crystallized from the interface between the remaining portion of the secondly crystallized poly-Si 152' and the thirdly liquefied silicon region (not shown) so that the silicon grains 153 grow toward a central portion of the laser beam 200. In addition, the thirdly liquefied silicon region (not shown) is thirdly crystallized from the interface between the remaining portion of the a-Si thin film (not shown) and the thirdly liquefied silicon region (not shown). When the third crystallization of the thirdly liquefied silicon region (not shown) is completed, the third protruding portion 156" is formed on the thirdly crystallized poly-Si 152" along the center of the laser beam 200. In FIG. 9C, the first, second and third protruding portions 156, 156' and 156" are substantially in parallel with one another.

The laser unit 10 is shifted by the interval that is greater than the half of the first width of the beam shape of the laser beam 200 so that the protruding portions 156, 156' and 156" are not liquefied in subsequent irradiation steps. Accordingly, the protruding portions 156, 156' and 156" are not eliminated. Therefore, a manufacturing time of the poly-Si thin film 150 is decreased.

Figure 10:
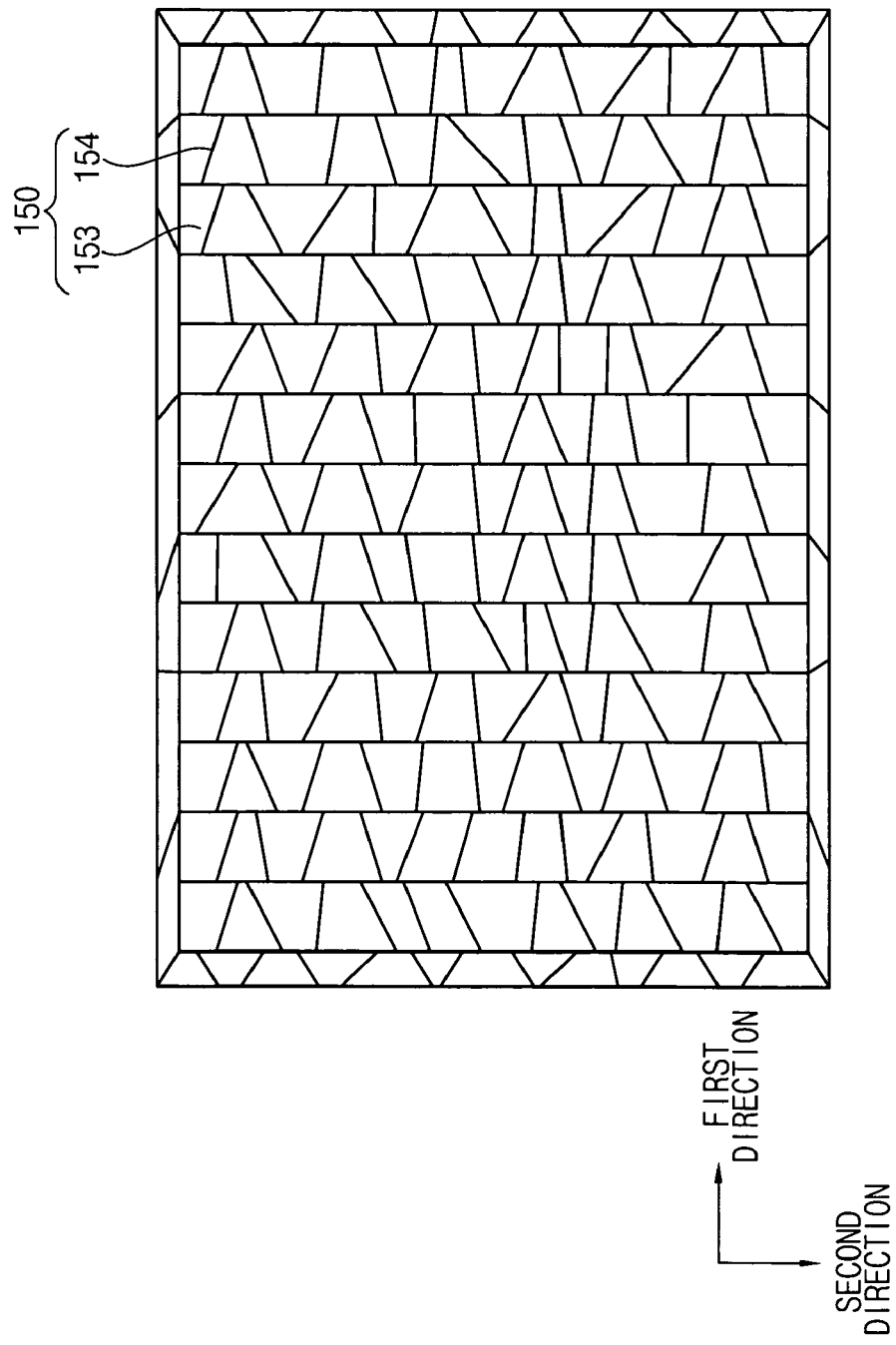
FIG. 10 is a plan view showing a poly-Si thin film formed by the method shown in FIGS. 9A to 9C.

FIG. 10 is a plan view showing a poly-Si thin film formed by the method shown in FIGS. 9A to 9C.

Referring to FIG. 10, the poly-Si thin film 150 includes the silicon grains 153, the silicon grain boundaries 154 and the protruding portions 156, 156' and 156" shown in FIGS. 9A to 9C.

The protruding portions 156, 156' and 156" shown in FIGS. 9A to 9C are substantially in parallel with one another. The silicon grains 153 extend between the protruding portions 156, 156' and 156" shown in FIGS. 9A to 9C. Generally, the silicon grain boundaries 154 are inclined with respect to the protruding portions 156, 156' and 156". In addition, the silicon grains 153 are also formed adjacent to sides of the poly-Si thin film 150.

The poly-Si thin film 150 including the protruding portions 156, 156' and 156" provider lower electrical mobility than a poly-Si thin film without protruding portions. The poly-Si thin film 150 having low electrical mobility can be used for a P-channel metal oxide semiconductor (PMOS) element.

Figure 11:
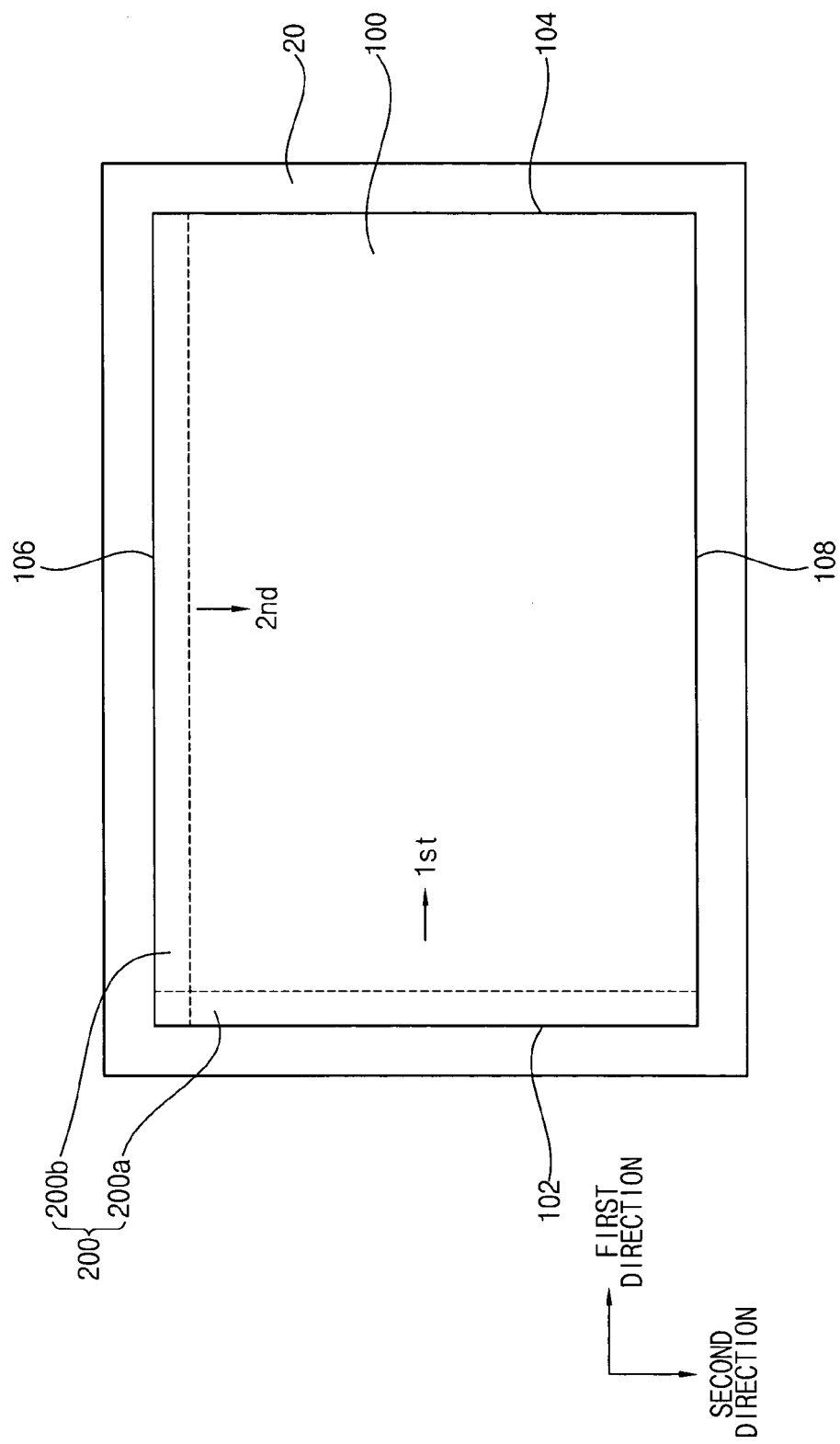
FIG. 11 is a plan view showing a method of manufacturing a poly-Si thin film in accordance with another embodiment of the present invention.

FIG. 11 is a plan view showing a method of manufacturing a poly-Si thin film in accordance with another embodiment of the present invention. The method of manufacturing the thin film of FIG. 11 is substantially the same as in FIGS. 1 to 8 except for the poly-Si thin film. Thus, the same reference numerals will be used to refer to the same or like parts as those described in FIGS. 1 to 8 and any further explanation concerning the above elements will be omitted.

Referring to FIG. 11, a laser unit that generates a laser beam 200 is prepared on an a-Si thin film 130 that is formed on a substrate 100. The substrate 100 is positioned on an XY-stage 20. The XY-stage 20 transports and rotates the substrate 100. The laser beam 200 has a beam shape such as an elliptical shape, a quadrangular shape, etc. A first width of the beam shape of the laser beam 200 is shorter than a second width of the beam shape of the laser beam 200. The second width of the beam shape of the laser beam 200 is controlled by an optical controller (not shown) of the laser unit 10 shown in FIG. 1.

The substrate 100 includes a first end portion 102 that is adjacent to a left side of the substrate 100, a second end portion 104 that is adjacent to a right side of the substrate 100, a third end portion 106 that is adjacent to an upper side of the substrate 100, and a fourth end portion 108 that is adjacent to a lower side of the substrate 100, as viewed from the perspective shown in FIG. 11. The laser beam 200 includes a first laser beam 200a and a second laser beam 200b. The second width of the beam shape of the first laser beam 200a is substantially equal to a side length of each of the first and second end portions 102 and 104. The second width of the beam shape of the second laser beam 200b is substantially equal to a side length of each of the third and fourth end portions 106 and 108.

The first laser beam 200a generated from the laser unit is irradiated onto a portion of the a-Si thin film adjacent to the first end portion 102 of the substrate to liquefy the portion of the a-Si thin film to form the liquefied silicon region. The portion of the a-Si thin film onto which the first laser beam 200a is irradiated is fully liquefied. That is, a phase of the a-Si thin film is changed from an amorphous solid phase to a liquid phase.

The liquefied silicon region is crystallized from sides of the liquefied silicon region through a solid phase crystallization. That is, the remaining portion of the a-Si functions as the core of the crystal growth so that the liquefied silicon region is crystallized from interfaces between the remaining portion of the a-Si and the liquefied silicon region to a center of the liquefied silicon region by a lateral growth. When the first crystallization of the liquefied silicon region is completed, a protruding portion is formed in the center of the crystallized poly-Si.

The laser unit is repetitively shifted by an interval from the first end portion 102 toward the second end portion 104, and the first laser beam 200a generated from the laser unit is repetitively irradiated onto a portion of the a-Si thin film, a portion of the crystallized poly-Si and the protruding portion to fully liquefy the portion of the a-Si thin film, the portion of the crystallized poly-Si and the protruding portion to form the liquefied silicon region, and eliminate the protruding portion. In FIG. 11, the interval of the first laser beam 200a is less than a half of a first width of the beam shape of the first laser beam 200a. The crystallized poly-Si forms first silicon grains, and the first silicon grains grow to form a first poly-Si thin film. The first poly-Si thin film includes the first silicon grains and the first silicon grain boundaries. The first silicon grains and the first silicon grain boundaries extend in a first direction.

When the first poly-Si thin film is completed, the XY-stage 20 is rotated by about ninety degrees so that the substrate 100 is rotated by about ninety degrees. The second width of the beam shape of the laser beam 200 is changed from the length of each of the first and second end portions 102 and 104 to the length of each of the third and fourth end portions 106 and 108. That is, the first laser beam 200a is changed into the second laser beam 200b.

The second laser beam 200b generated from the laser unit is irradiated onto a portion of the first poly-Si thin film adjacent to the third end portion 106 of the substrate 100 to fully liquefy the portion of the first poly-Si thin film to form the liquefied silicon region. Alternatively, the first poly-Si thin film may be partially melted to form a partially liquefied silicon region. The liquefied silicon region is then crystallized through the solid phase crystallization, and a protruding portion that extending in the first direction is formed. The laser unit is repetitively shifted by an interval from the third end portion 106 toward the fourth end portion 108, and the second laser beam 200b generated from the laser unit is repetitively irradiated onto a portion of the first poly-Si thin film, a portion of the crystallized poly-Si and a protruding portion to fully liquefy the portion of the a-Si thin film, the portion of the crystallized poly-Si and the protruding portion to form the liquefied silicon region, and eliminate the protruding portion. In FIG. 11, the interval of the second laser beam 200b is more than a half of a first width of the beam shape of the second laser beam 200b. The interval of the second laser beam 200b may be substantially equal to the interval of the first laser beam 200a.

The crystallized poly-Si forms second silicon grains, and the second silicon grains grow to form a second poly-Si thin film. The second poly-Si thin film includes the second silicon grains and second silicon grain boundaries. In FIG. 11, the second silicon grains are formed by a growth of the first silicon grains in the first direction so that the second silicon grains have a larger size than the first silicon grains.

Figure 12A:
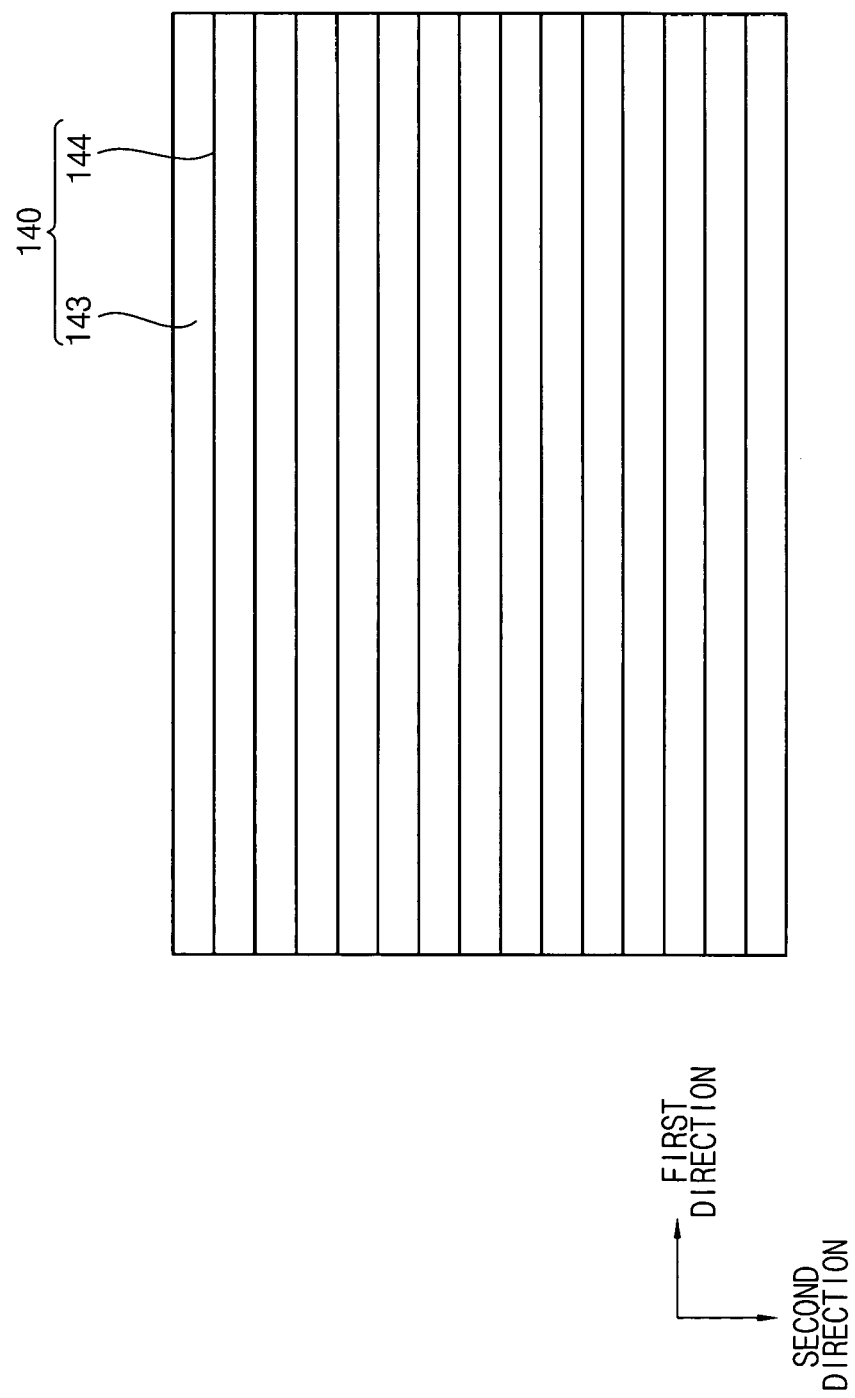
Figure 12B:
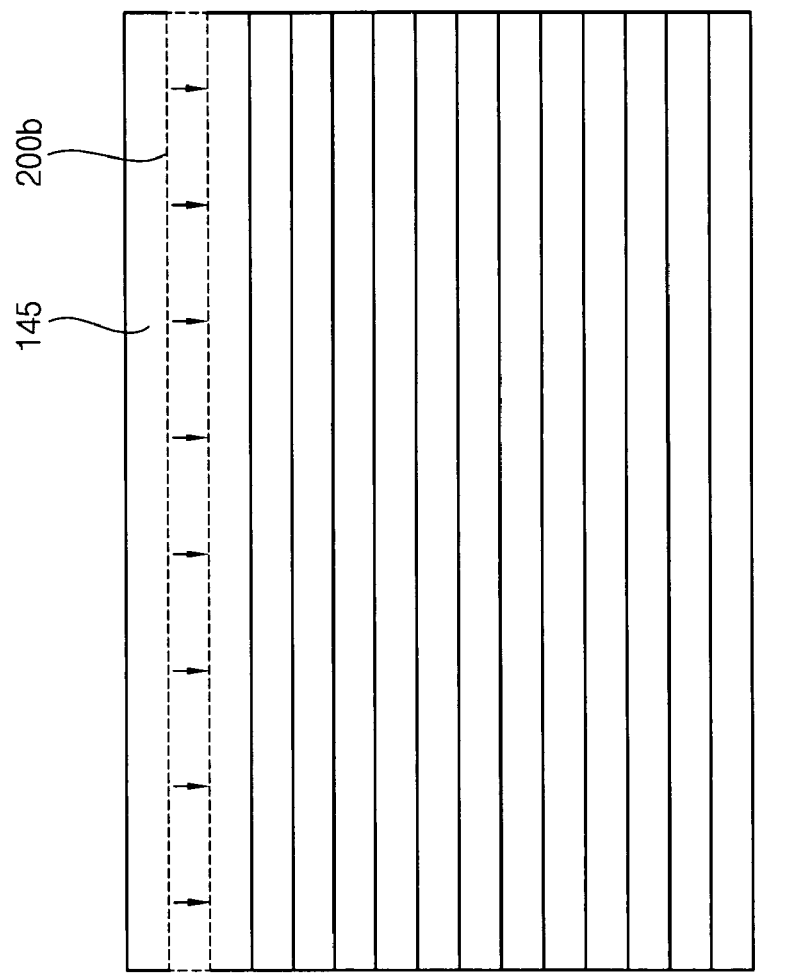

FIGS. 12A to 12C are plan views showing the method shown in FIG. 11.

Referring to FIG. 12A, the first laser beam 200a is repetitively irradiated onto the a-Si thin film, and shifted by an interval from the first end portion 102 toward the second end portion 104 so that the first poly-Si thin film 140 without protruding portions is formed. The first poly-Si thin film 140 includes the first silicon grains 143 and the first silicon grain boundaries 144 that extend in the first direction.

Referring to FIG. 12B, in order to grow the first silicon grains 143 in the second direction, the second laser beam 200b generated from the laser unit is irradiated onto a portion of the first poly-Si thin film 140 adjacent to the third end portion 106 of the substrate 100 to fully liquefy the portion of the first poly-Si thin film 140, thus forming the liquefied silicon region. Alternatively, the portion of the first poly-Si thin film 140 onto which the second laser beam 200b is irradiated may be partially liquefied to form a partially liquefied silicon region. The first silicon grain boundaries 144 are eliminated by the liquefaction. Therefore, the first silicon grains 143 grow in the second direction to form the second silicon grains 162.

Referring to FIG. 12C, the laser unit is repetitively shifted by an interval 'I' from the third end portion 106 toward the fourth end portion 108, and the second laser beam 200b generated from the laser unit is repetitively irradiated onto the portion of the first poly-Si thin film 140 so that the first silicon grains 143 repetitively grow in a second direction with respect to the substrate. Therefore, the second silicon grains 162 have greater size than the first silicon grains 143. Alternatively, the second silicon grains 162 may be pseudo mono-crystalline grains.

FIG. 13 is a plan view showing the poly-Si thin film formed by the method shown in FIG. 11.

Referring to FIG. 13, the second poly-Si thin film 160 includes the second silicon grains 162 and second silicon grain boundaries 164. Each of the second silicon grains 162 extends in the first and second directions. The second silicon grain boundaries 164 are positioned between adjacent second silicon grains 162. In FIG. 13, the second silicon grain boundaries 164 have a roughly circular shape. As the size of the second silicon grains 162 is increased, the electrical mobility of the second poly-Si thin film 160 is also increased.

In addition, as the size of the second silicon grains 162 is increased, a density of the silicon grain boundaries 164 is decreased to decrease a leakage current that may be formed through the silicon grain boundaries 164 when a TFT is turned off.

The substrate 100 is rotated by the ninety degrees, and the first and second laser beams 200 are irradiated onto the a-Si thin film 130 in the first and second directions to maximize the size of the second poly-Si grains 162, thereby increasing the electrical mobility.

Figure 14A:
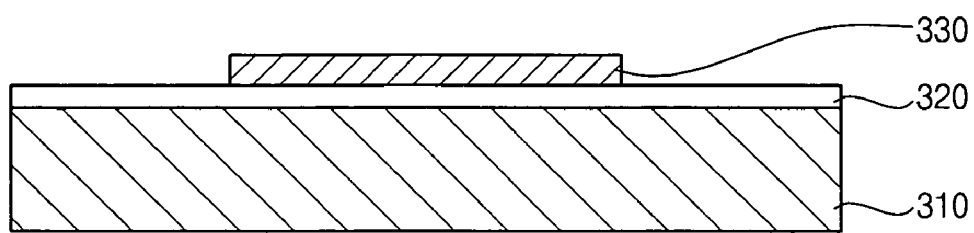
FIGS. 14A to 14D are cross-sectional views showing a method of manufacturing a poly-Si thin film in accordance with one embodiment of the present invention.

FIGS. 14A to 14D are cross-sectional views showing a method of manufacturing a poly-Si thin film in accordance with one embodiment. In particular, FIG. 14A is a cross-sectional view showing a poly-Si pattern on a transparent substrate.

Referring to FIG. 14a, an oxide layer 320 is formed on a transparent substrate 310. An a-Si thin film is formed on the oxide layer 320.

The a-Si thin film is converted into a poly-Si thin film using a laser beam. In particular, a laser unit that generates the laser beam is prepared on the transparent substrate 310 having the a-Si thin film. The laser beam has a beam shape such as an elliptical shape, a quadrangular shape, etc. A second width of the beam shape of the laser beam is greater than a first width of the beam shape of the laser beam. The laser beam is irradiated onto a portion of the a-Si thin film adjacent to a first end portion of the transparent substrate 310 to fully liquefy a portion of the a-Si thin film. Alternatively, the portion of the a-Si thin film adjacent to a first end portion of the transparent substrate 310 may be partially liquefied. Silicon grains grow in the liquefied silicon region through a solid phase crystallization. The laser beam is repetitively irradiated onto the a-Si thin film, and shifted from the first end portion to a second end portion of the transparent substrate 310 to form a poly-Si thin film.

The poly-Si thin film is partially etched through an etching process such as a plasma etching, a wet etching, etc., to form a poly-Si pattern 330.

Figure 14B:
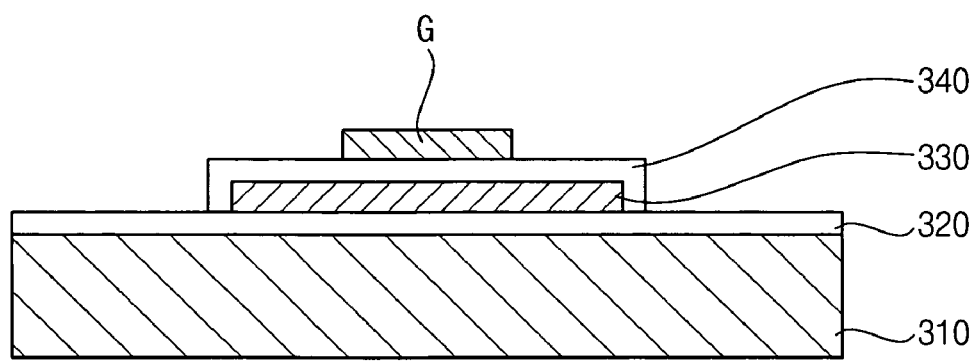

Referring to FIG. 14B, a first insulating layer 340 is formed on the poly-Si pattern 330 to protect the poly-Si pattern 330. In FIG. 14B, the first insulating layer 340 is formed through a plasma enhanced chemical vapor deposition (PECVD) process.

A gate electrode G is formed on the first insulating layer 340. In FIG. 14B, the gate electrode G is positioned at the center of the poly-Si pattern 330. In particular, a metal is deposited on the first insulating layer 340, and partially etched to form the gate electrode G.

Figure 14C:
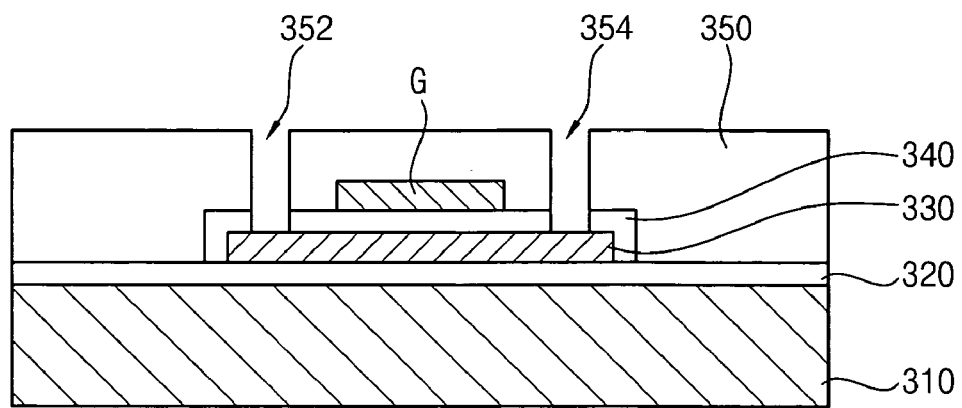

Referring to FIG. 14C, a second insulating layer 350 is formed on the gate electrode G and the first insulating layer 340. The second insulating layer 350 may be formed through a PECVD process. A thickness of the second insulating layer 350 is more than a predetermined thickness to improve credibility and reliability of the TFT 300 and to prevent a crosstalk. In FIG. 14C, the thickness of the second insulating layer 350 is more than about 6,000 Å.

The first and second insulating layers 340 and 350 are partially etched to form a first contact hole 352 and a second contact hole 354. The first contact hole 352 is adjacent to a right side of the gate electrode G, and the second contact hole 354 is adjacent to a left side of the gate electrode G. The second contact hole 354 is spaced apart from the first contact hole 352.

Figure 14D:
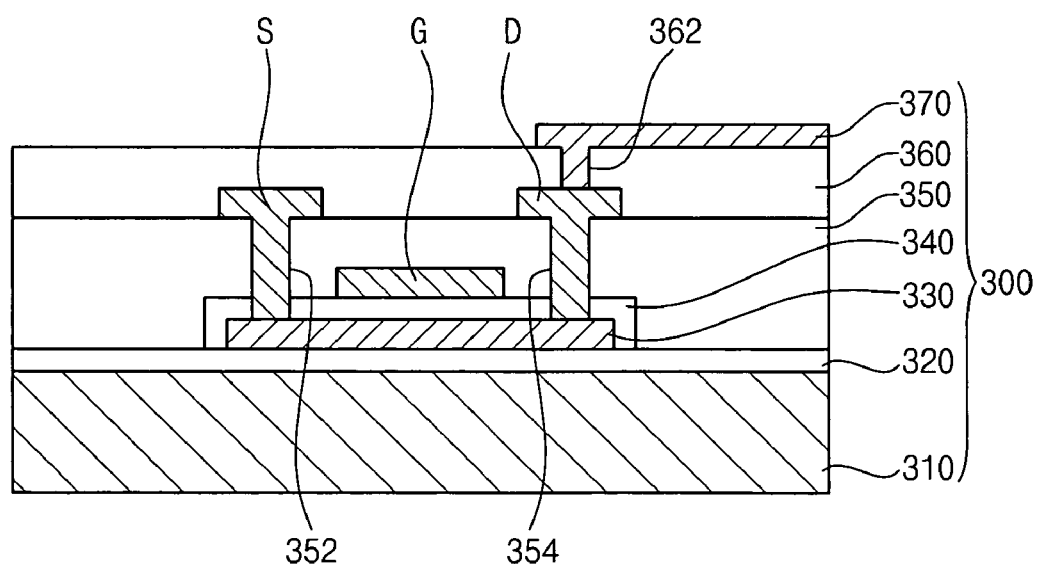

Referring to FIG. 14D, a source electrode S and a drain electrode D are formed on the second insulating layer 350. The source electrode S is electrically connected to the poly-Si pattern 340 through the first contact hole 352, and the drain electrode D is electrically connected to the poly-Si pattern 340 through the second contact hole 354.

A protecting layer 360 is formed on the second insulating layer 350 having the source electrode S and the drain electrode D. The protecting layer 360 is partially etched to form a pixel contact hole 362. A pixel electrode 370 is formed on the protecting layer 360. The pixel electrode 370 is transparent. The pixel electrode 370 is electrically connected to the drain electrode D through the pixel contact hole 362.

The poly-Si pattern 340 having high electrically mobility is formed by the laser beam to improve electrical characteristics of the TFT 300.

The TFT 300 is a top gate type TFT. Alternatively, the TFT may be a bottom gate type TFT that has a poly-Si pattern interposed between a gate electrode and source/drain electrodes.

In accordance with the present invention, the laser beam is repetitively irradiated onto the substrate, and shifted from the first end portion toward the second end portion to form a poly-Si thin film having increased grain size and improved electrical characteristics.

In addition, the interval of the shift of the laser unit is controlled to control a manufacturing time of the poly-Si thin film.

The laser unit may be rotated by about ninety degrees so that the laser beam is firstly and secondly irradiated onto the a-Si thin film. The size of the silicon grains is maximized to increase the electrical mobility.

The poly-Si pattern has high electrical mobility so that the TFT has improved electrical characteristics.

Although the exemplary embodiments of the present invention have been described, it is understood that the present invention should not be limited to these exemplary embodiments but various changes and modifications can be made by one of ordinary skill in the art within the spirit and scope of the present invention as hereinafter claimed.

What is claimed is:

1. A method of manufacturing a polysilicon thin film comprising:
    irradiating a laser beam generated from a laser unit onto a first portion of an amorphous silicon thin film to liquefy the first portion of the amorphous silicon thin film, the laser beam having a beam shape including a first width substantially in parallel with the first direction and a second width substantially in parallel with a second direction substantially perpendicular to the first direction, the second width being greater than the first width, the beam shape being substantially the same shape as a shape of the laser beam irradiated onto the first portion, the first portion of the amorphous silicon thin film being on a first end portion of a substrate;
    crystallizing the liquefied silicon of the first portion to form silicon grains;
    transporting the substrate for shifting the laser beam by an interval in a first direction from the first end portion toward a second end portion of the substrate opposite the first end portion;
    irradiating the laser beam onto a second portion of the amorphous silicon thin film to liquefy the second portion of the amorphous silicon thin film, the second portion partially overlapping the first portion; and
    crystallizing the liquefied silicon of the second portion to extend the silicon grains to form a first polysilicon thin film,
    wherein the interval of the laser beam is no more than about a half of the first width of the beam shape of the laser beam.

2. The method of claim 1, wherein the laser is irradiated so that a size of each of the silicon grains is greater in the first direction than in a second direction substantially perpendicular to the first direction.

3. The method of claim 1, wherein the second width of the beam shape of the laser beam is substantially equal to a side length of the substrate.

4. The method of claim 1, wherein the first width of the beam shape of the laser beam is about 3 μm to about 10 μm.

5. The method of claim 1, wherein the interval is about 1 μm to about 4 μm in the first direction.

6. The method of claim 1, wherein an overlapped area between the irradiation of the laser beam before the shifting and the irradiation of the laser beam after the shifting is no more than about 90% of an area of each of the laser beams.

7. The method of claim 1, wherein the laser beam is generated from an excimer laser.

8. The method of claim 1, wherein a wavelength of the laser beam is about 200 nm to about 400 nm.

9. The method of claim 1, wherein a frequency of the laser beam is about 300Hz to about 6,000 Hz.

10. The method of claim 1, wherein the laser beam comprises a predetermined energy intensity for liquefying the amorphous silicon thin film.

11. The method of claim 1, wherein the amorphous silicon thin film is liquefied by one pulse of the laser beam.

12. The method of claim 1, further comprising:
    rotating the substrate by a predetermined angle after forming the first polysilicon thin film;
    transporting the substrate for shifting the laser beam from a third end portion of the substrate between the first and second end portions to a fourth end portion of the substrate opposite the third end portion by an interval in a second direction that is substantially in perpendicular to the first direction; and irradiating the laser beam onto a third portion of the first polysilicon thin film to extend the silicon grains in the second direction.

13. The method of claim 1, wherein the third portion of the first polysilicon thin film onto which the laser beam is irradiated is fully liquefied.

14. The method of claim 1, wherein an energy profile of the laser beam comprises two inclined portions having an inclined energy distribution and a flat portion interposed between the inclined portions, and the flat portion comprises a constant energy distribution.

15. The method of claim 14, wherein an energy intensity of the flat portion is about 400 mJ/cm$^2$ to about 1,000 mJ/cm$^2$.

16. The method of claim 14, wherein a width of each of the inclined portions is no more than about 10 μm.

17. The method of claim 14, wherein a variation of an energy intensity of the flat portion is no more than about 5% of a maximum energy intensity of the flat portion.

18. A method of manufacturing a thin film transistor comprising:
    forming an amorphous silicon thin film on a substrate;
    irradiating a laser beam generated from a laser unit onto the amorphous silicon thin film to change the amorphous silicon thin film into a polysilicon thin film;
    partially etching the polysilicon thin film to form a polysilicon pattern;
    forming a first insulating layer on the substrate having the polysilicon pattern to protect the polysilicon pattern;
    forming a gate electrode on the first insulating layer corresponding to the polysilicon pattern;
    forming a second insulating layer on the first insulating layer and the gate electrode;
    partially etching the first and second insulating layers to form contact holes; and
    forming a source electrode and a drain electrode on the second insulating layer, the source electrode being spaced apart from the drain electrode, the source and drain electrodes being electrically connected to the polysilicon pattern through the contact holes, respectively
    wherein the laser beam has a beam shape including a first width substantially in parallel with the first direction and a second width substantially in parallel with a second direction substantially perpendicular to the first direction, the second width being greater than the first width.

19. The method of claim 18, wherein the irradiating the laser beam onto the amorphous silicon thin film comprises:
    irradiating the laser beam on a first portion of the amorphous silicon thin film to liquefy the first portion of the amorphous silicon thin film, the first portion of the amorphous silicon thin film being on a first end portion of a substrate;
    crystallizing the liquefied silicon of the first portion to form silicon grains;
    transporting the substrate for shifting the laser beam from the first end portion to a second end portion of the substrate opposite the first end portion by an interval in a first direction; and
    irradiating the laser beam onto a second portion of the amorphous silicon thin film to liquefy the second portion of the amorphous silicon thin film, the second portion partially overlapping the first portion; and
    crystallizing the liquefied silicon of the second portion to extend the silicon grains to form the polysilicon thin film,
    wherein an extending direction of the silicon grains is substantially parallel with a transporting direction of the substrate.

20. The method of claim 19, wherein the portion of the amorphous silicon thin film onto which the laser beam is irradiated is fully liquefied.

21. The method of claim 19, the irradiating the laser beam onto the amorphous silicon thin film further comprises:
    rotating the substrate by a predetermined degree after forming the first polysilicon thin film;
    transporting the substrate for shifting the laser beam from a third end portion of the substrate between the first and second end portions to a fourth end portion of the substrate opposite the third end portion by an interval in a second direction that is substantially perpendicular to the first direction; and
    irradiating the laser beam onto a third portion of the polysilicon thin film to extend the silicon grains in the second direction.

22. The method of claim 21, wherein the rotating the substrate comprises:
    rotating the substrate by about ninety degrees; and
    changing a width of the laser beam from a side length corresponding to the first end portion into a side length corresponding to the third end portion.

23. A method of manufacturing a polysilicon thin film comprising:
    irradiating a laser beam generated from a laser unit onto a first portion of an amorphous silicon thin film to liquefy the first portion of the amorphous silicon thin film, the laser beam having a beam shape including a first width substantially in parallel with the first direction and a second width substantially in parallel with a second direction substantially perpendicular to the first direction, the second width being greater than the first width, the beam shape being substantially the same shape as a shape of the laser beam irradiated onto the first portion, the first portion of the amorphous silicon thin film being on a first end portion of a substrate;
    crystallizing the liquefied silicon of the first portion to form silicon grains;
    transporting the substrate for shifting the laser beam by an interval in a first direction from the first end portion toward a second end portion of the substrate opposite the first end portion;
    irradiating the laser beam onto a second portion of the amorphous silicon thin film to liquefy the second portion of the amorphous silicon thin film, the second portion partially overlapping the first portion; and
    crystallizing the liquefied silicon of the second portion to extend the silicon grains to form a first polysilicon thin film,
    wherein the interval of the laser beam is more than about a half of the first width of the beam shape of the laser beam, and no more than the first width of the beam shape of the laser beam.

* * * * *